United States Patent
Maroney et al.

(10) Patent No.: US 8,996,164 B2
(45) Date of Patent: Mar. 31, 2015

(54) COMPUTER-CONTROLLED COMMON ACCESS CABINET

(75) Inventors: Ralf Maroney, Stuart, FL (US); Andrew Asim Ardaman, Windermere, FL (US); Marc Karpel, Northford, CT (US)

(73) Assignee: Plug-In Storage Systems, Inc., West Haven, CT (US)

( * ) Notice: Subject to any disclaimer, the term of this patent is extended or adjusted under 35 U.S.C. 154(b) by 378 days.

(21) Appl. No.: 13/528,783

(22) Filed: Jun. 20, 2012

(65) Prior Publication Data

US 2012/0330462 A1 Dec. 27, 2012

(51) Int. Cl.
*H05K 7/14* (2006.01)

(52) U.S. Cl.
CPC .................................. *H05K 7/1498* (2013.01)
USPC .................. 700/242; 700/237; 221/150 R

(58) Field of Classification Search
CPC ................................................ H05K 7/1498
USPC .......................................... 700/237, 241, 242
See application file for complete search history.

(56) References Cited

U.S. PATENT DOCUMENTS

| 6,151,536 | A * | 11/2000 | Arnold et al. ................. 700/237 |
| 6,338,007 | B1 * | 1/2002 | Broadfield et al. ............ 700/231 |
| 7,654,261 | B1 * | 2/2010 | Rockhold ...................... 700/237 |
| 7,728,711 | B2 | 6/2010 | Shoenfeld |
| 8,140,187 | B2 * | 3/2012 | Campbell et al. .............. 700/243 |
| 2003/0117281 | A1 * | 6/2003 | Sriharto et al. ............ 340/568.1 |
| 2005/0251687 | A1 | 11/2005 | Bachinski |
| 2006/0232381 | A1 | 10/2006 | Gauthier |
| 2007/0125100 | A1 * | 6/2007 | Shoenfeld ....................... 62/125 |

OTHER PUBLICATIONS

International Preliminary Report on Patentability Written Opinion of the International Authority.

* cited by examiner

*Primary Examiner* — Timothy Waggoner
(74) *Attorney, Agent, or Firm* — Raymond A. Nuzzo

(57) ABSTRACT

A control system for a common access cabinet having a plurality of drawers and electrically controlled latches. Each latch corresponds to one drawer and is configured to receive an electrical signal. The electrical signal contains an address assigned to a particular drawer. When a latch receives a signal that defines the address of the drawer to which that latch corresponds, the latch unlocks that corresponding drawer. The latches receive the signals over an asynchronous serial interface bus. A user input device receives user identification data that is processed by a processor device to determine if the user is authorized to access any of the drawers. If the user is authorized, the processor device generates a signal that contains an address that corresponds to a drawer identified in the user identification data. The signal is converted to an asynchronous serial signal which is routed to the asynchronous serial interface bus.

37 Claims, 21 Drawing Sheets

COMPUTER-CONTROLLED COMMON ACCESS CABINET

CROSS-REFERENCE TO RELATED APPLICATIONS

This application claims the benefit of U.S. provisional application No. 61/500,126, filed Jun. 22, 2011, the disclosure of which application is hereby incorporated by reference in its entirety.

TECHNICAL FIELD

The present invention relates a computer-controlled, multi-drawer, common access cabinet.

BACKGROUND ART

Computer-controlled cabinets are described in U.S. Pat. Nos. 7,142,944 and 7,426,425.

DISCLOSURE OF THE INVENTION

It is an object of the present invention to provide a unique control system for a computer-controlled-multi-drawer, common access cabinet.

Accordingly, in one embodiment, the present invention is directed to a control system for controlling the operation of a common access cabinet that has a plurality of cabinet drawers that are movable between a closed position and an opened position, the control system comprising a plurality of latch systems mounted within the cabinet, wherein each latch system is positioned in proximity to a corresponding cabinet drawer and configured to receive a control signal. A latch system unlocks its corresponding cabinet drawer to allow the cabinet drawer to be moved to the opened position when the latch system receives a latch control signal that defines an address that is assigned to the cabinet drawer to which that latch system corresponds. The control system further comprises an asynchronous serial interface bus in electronic signal communication with the plurality of latch systems and a user input device to enable a user to input user identification data that identifies the user and the cabinet drawer to which the user is authorized to access. The control system further comprises a processor device to process the user identification data to determine if the user identification data is valid, and generate a latch control signal that defines an address of a drawer identified by the user identification data if the user identification data is valid. The control system includes a converter device to convert the latch control signal to an asynchronous serial signal and provide the asynchronous serial signal to the asynchronous serial interface bus so that all latch systems receive the latch control signal.

In another embodiment, the present invention is directed to a control system for controlling the operation of a multi-drawer, common access cabinet having a plurality of drawers, wherein the plurality of cabinet drawers are slidably mounted to the cabinet and slide between a closed position and an opened position. The control system comprises a plurality of latch control circuits and a plurality of electrically controlled latches. The latch control circuits and latches are mounted within the cabinet. Each latch control circuit is electrically connected to a corresponding latch. Each latch is positioned in proximity to a corresponding cabinet drawer. Each latch control circuit is configured to receive a latch control signal. In response to the latch control signal, the latch control circuit outputs an electrical signal (e.g. D.C. voltage) that controls the corresponding latch to disengage the cabinet drawer in order to unlock the drawer and allow a user to pull out the drawer. The latch is configured to lock the drawer when the user pushes the drawer completely into the cabinet. The control system further comprises an asynchronous serial interface bus in electronic signal communication with the plurality of latch control circuits. In one embodiment, the asynchronous serial interface bus is a RS-485 bus. The control system further comprises a USB hub and a USB-To-RS-485 converter device. This USB-To-RS-485 converter device has an asynchronous serial interface port in electronic signal communication with the asynchronous serial interface bus. The USB-To-RS-485 converter device also has a USB signal port in electronic signal communication with the USB hub. The USB-To-RS-485 converter device converts USB signals inputted into its USB signal port into asynchronous serial data signals. The USB-To-RS-485 converter device also converts asynchronous serial data signals inputted into its asynchronous serial interface port into USB signals. The control system further comprises a user input device in electronic signal communication with the USB hub. The user input device receives user identification data inputted by a user wherein the user identification data identifies the user and the cabinet drawer or drawers to which the user is authorized to access. The control system further comprises a computer in electronic signal communication with the USB hub. The computer processes the user identification data to determine if the user identification data is valid and whether the user is authorized to access any of the cabinet drawers. The computer comprises a programmable microprocessor and data storage devices for storing therein user identification data and data identifying the cabinet drawers to which a user is entitled to access. The computer also has a USB port for outputting latch control signals. The computer is programmed to output latch control signals to selectively unlock one or more cabinet drawers in accordance with valid user identification data. Each latch control signal contains a preselected address corresponding to a particular cabinet drawer 62. The latch control signals are inputted into the USB hub and then routed to the USB-To-RS-485 converter device wherein the latch control signals are converted to asynchronous serial signals and routed to the asynchronous serial interface bus which is in electronic signal communication with the latch control circuits. Only the latch control circuit having the same preselected address stored therein will respond to the latch control signal. If a latch control circuit has the same preselected address stored therein, the latch control circuit outputs a voltage signal to its corresponding latch. This voltage signal will cause the corresponding latch to disengage and release the cabinet drawer. The control system further comprises a display device in electronic signal communication with the USB hub. The display device displays to the user (i) data entry queues and commands, and (ii) messages relating to the validity of the user identification data inputted by the user and whether access is authorized or denied. In an alternate embodiment, the user input device is in direct electrical signal communication with the computer.

Other embodiments of the invention are described in detail in the following description. Objects, advantages and benefits of the invention will be apparent from this description.

BRIEF DESCRIPTION OF THE DRAWINGS

Although the scope of the present invention is much broader than any particular embodiment, a detailed description of the preferred embodiments follows together with illustrative figures, wherein like reference numerals refer to like components, and wherein.

BEST MODE FOR CARRYING OUT THE INVENTION

Figure 1:
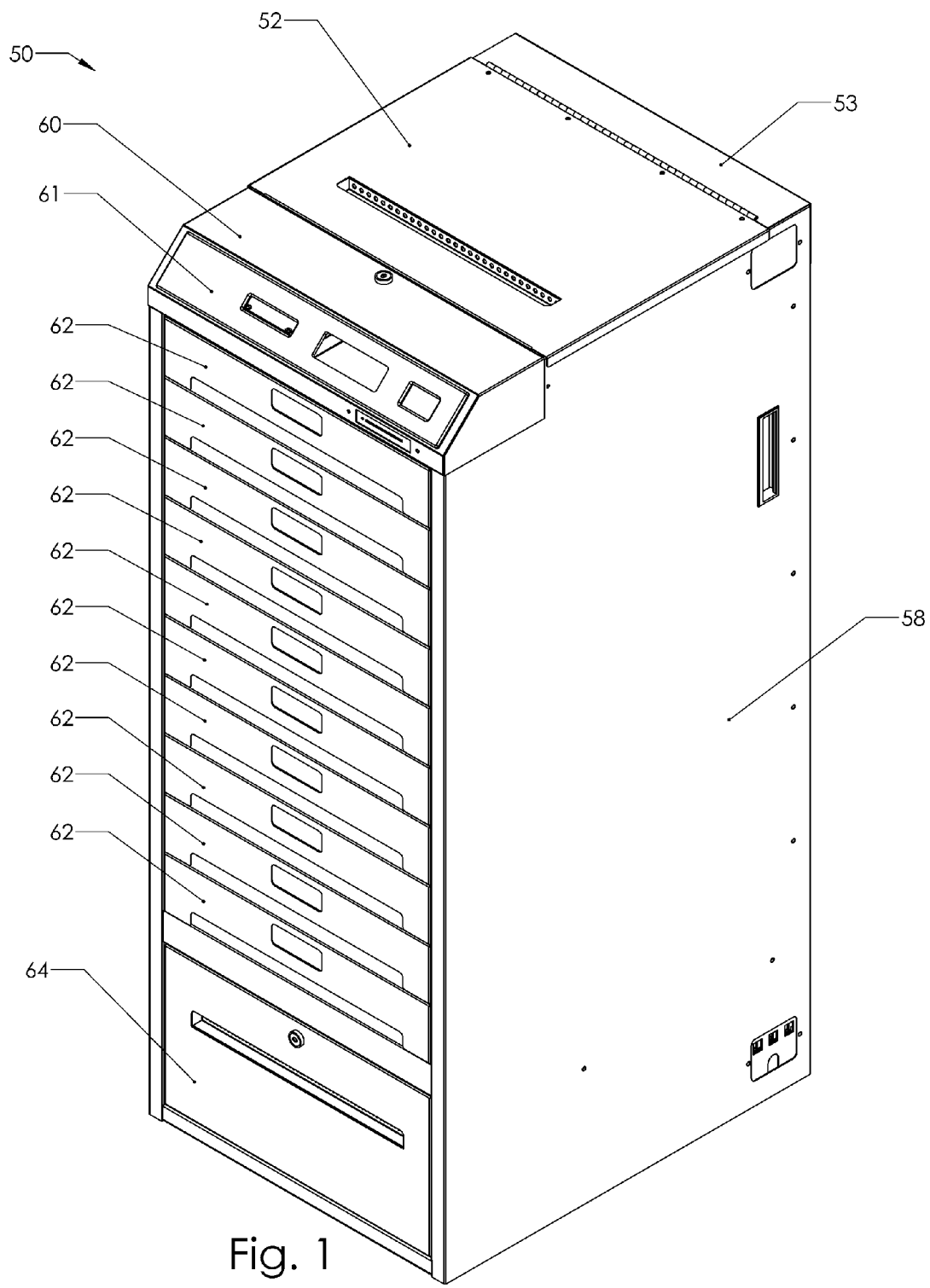
FIG. 1 is a perspective view of a computer-controlled, common access cabinet in accordance with one embodiment of the present invention, the view showing the front and right side of the cabinet.
Figure 2:
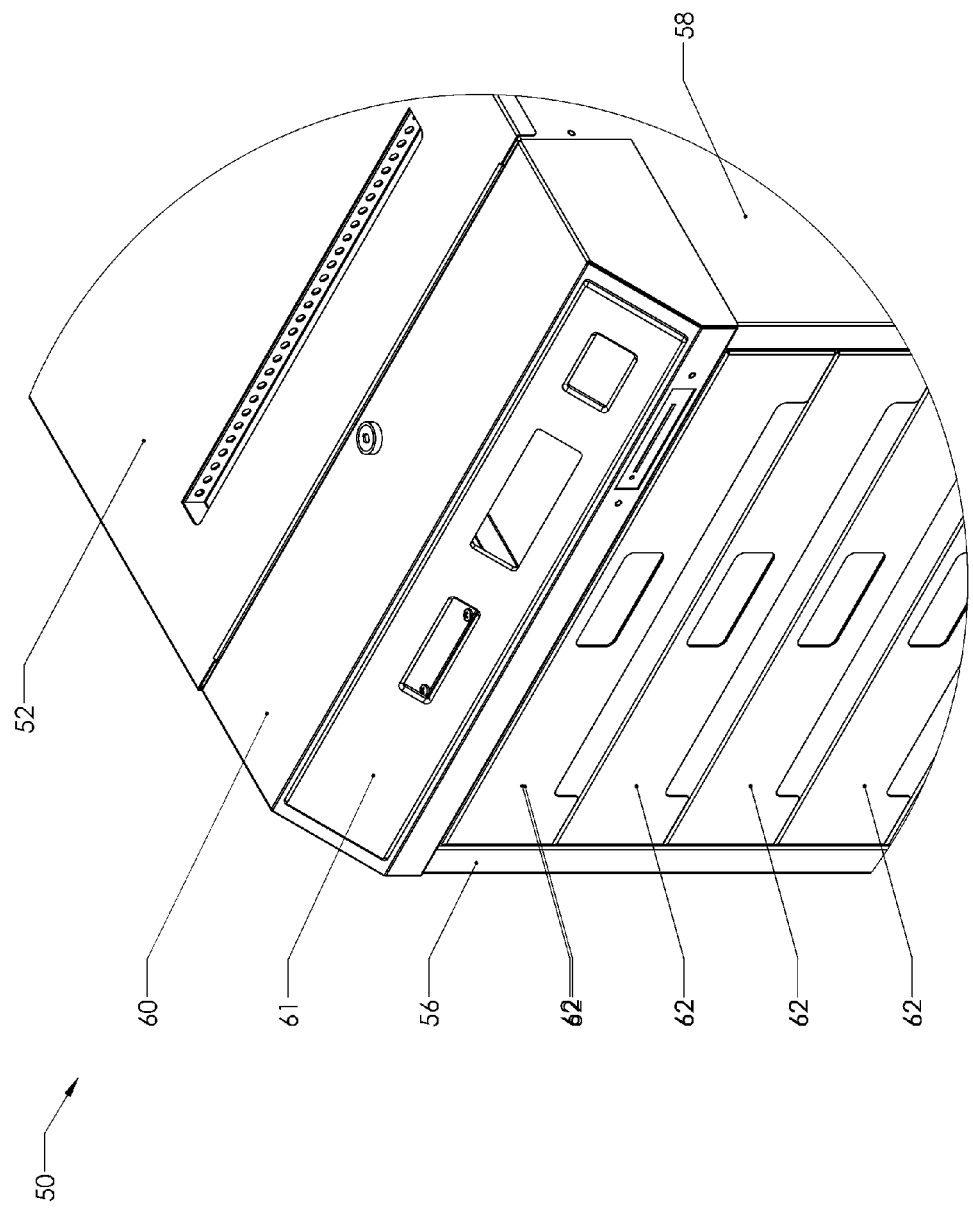
FIG. 2 an enlarged view, in perspective, of a portion of the view shown in FIG. 1.
Figure 3:
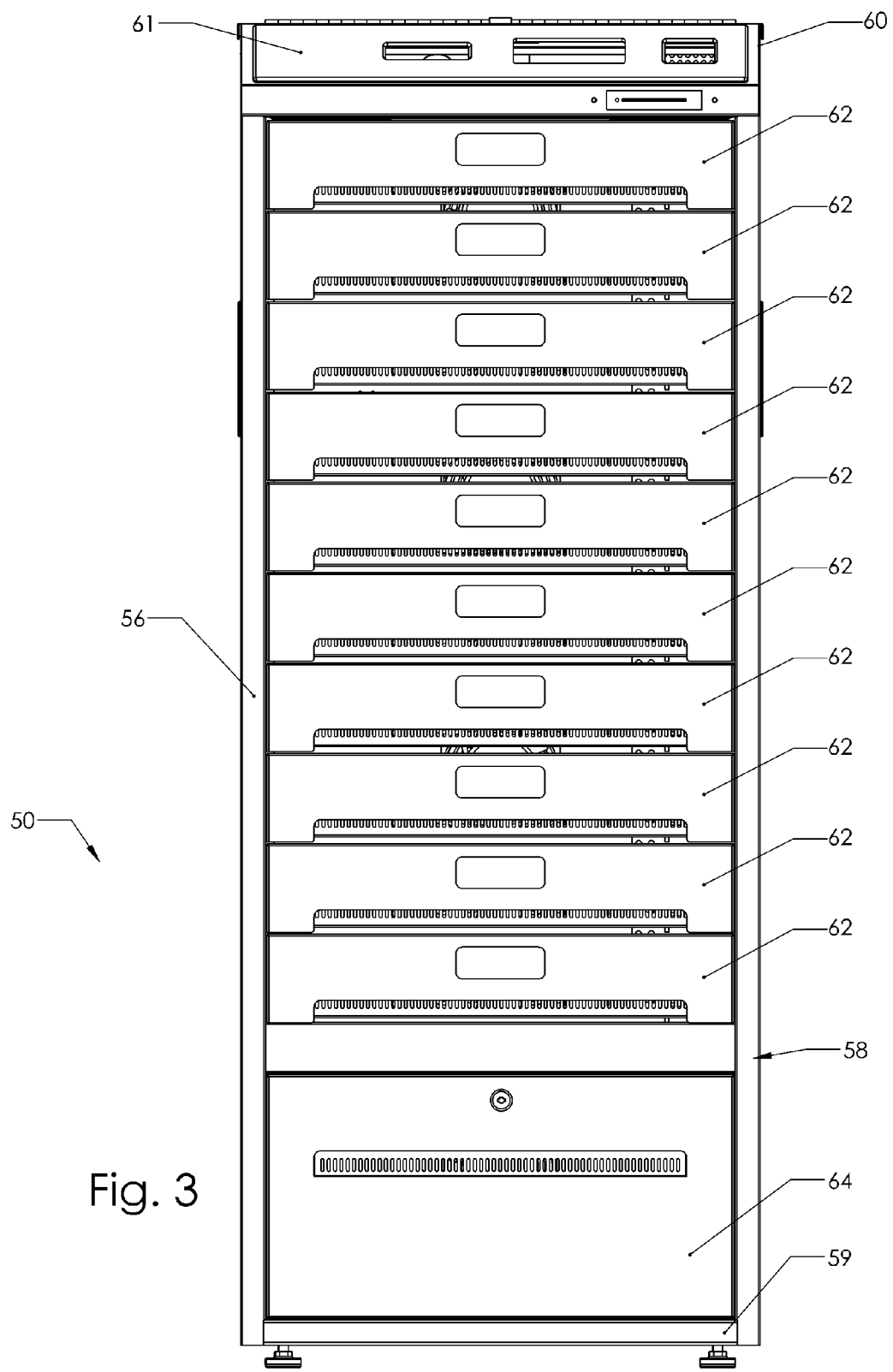
FIG. 3 is a front view of the computer-controlled, common access cabinet.
Figure 4:
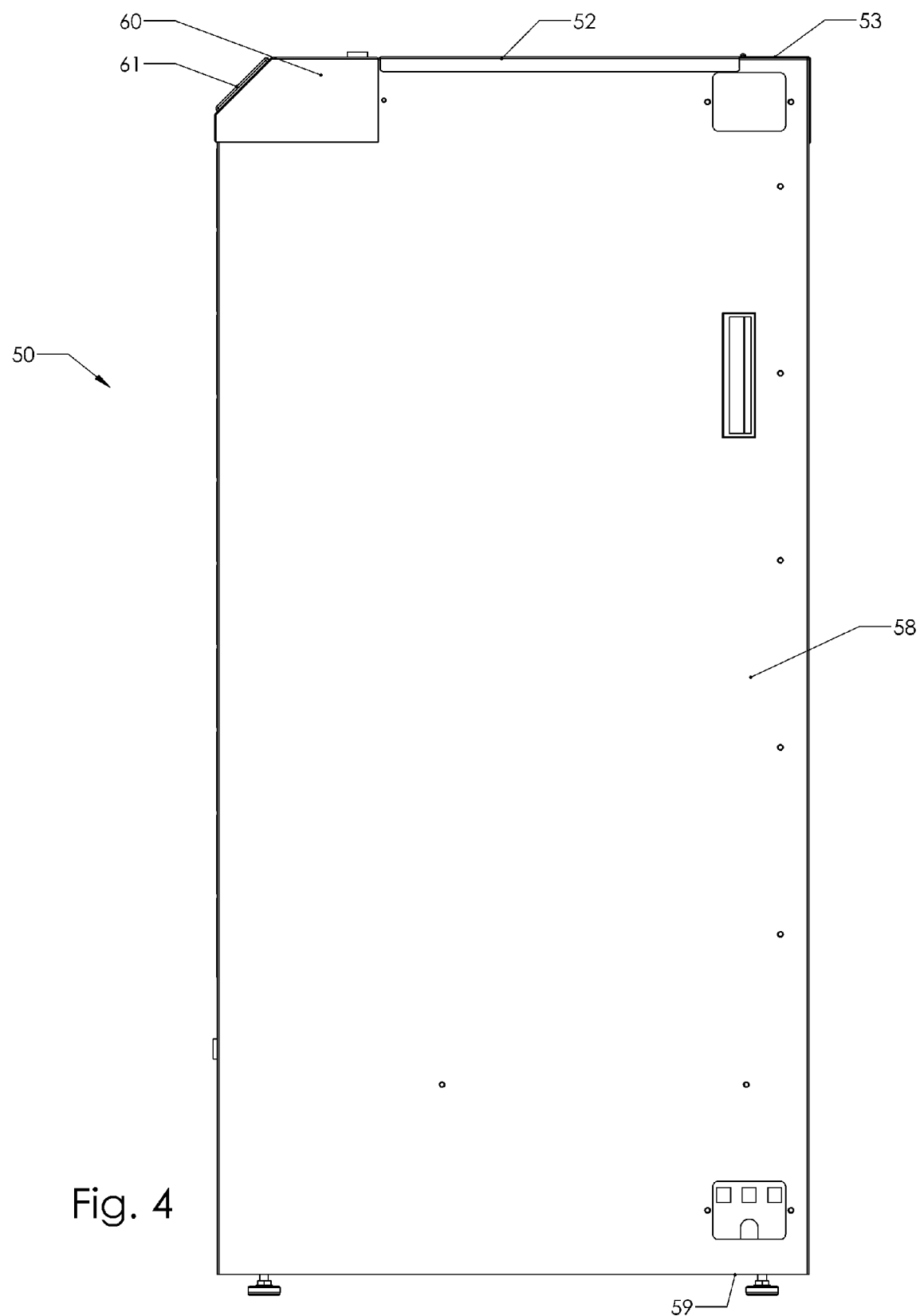
FIG. 4 is a right-side view, in elevation, of the computer-controlled, common access cabinet.
Figure 5:
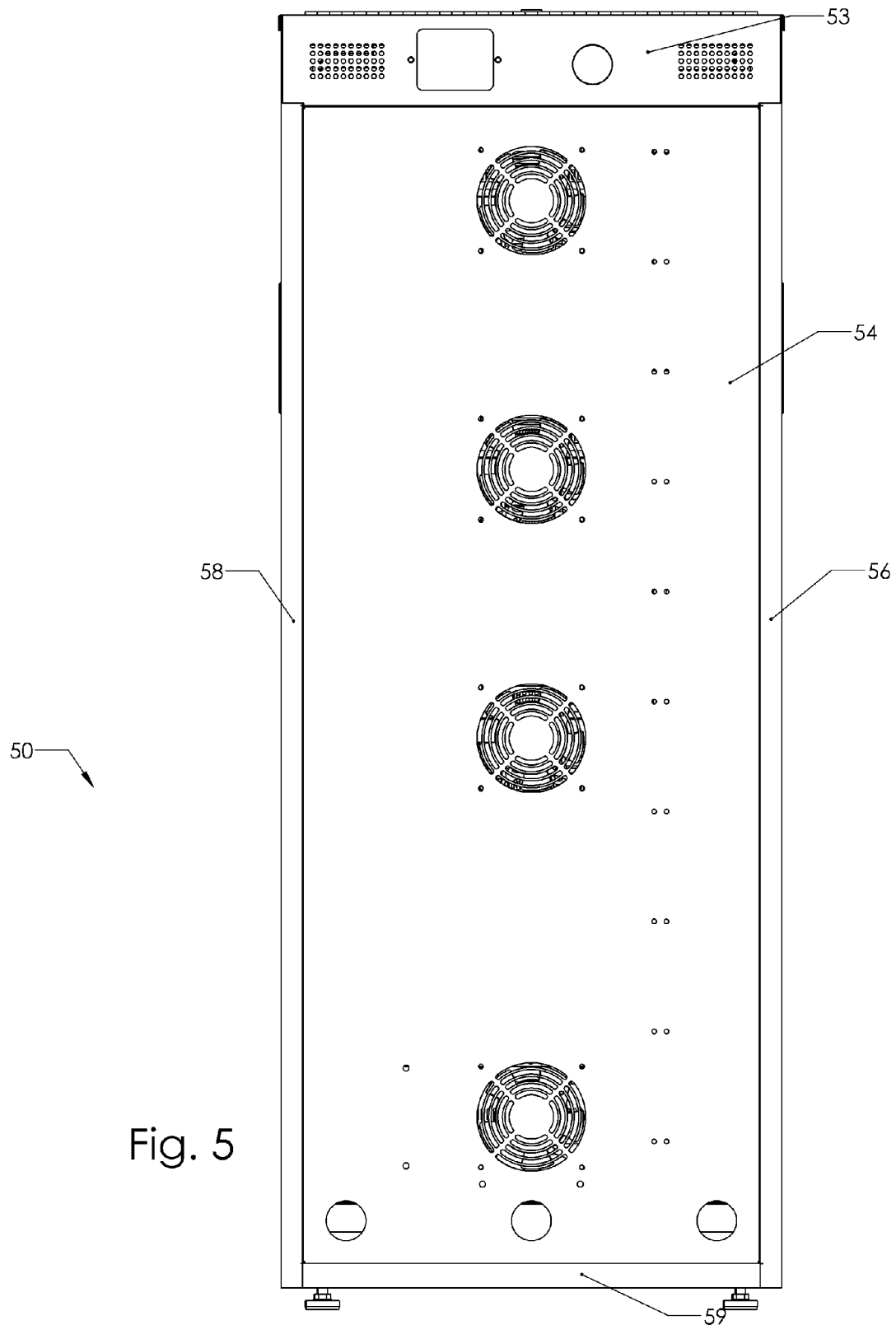
FIG. 5 is a rear view of the computer-controlled, common access cabinet, the view not showing other components or devices normally attached to the rear of the cabinet in order to facilitate viewing of a rear panel of the cabinet.
Figure 6:
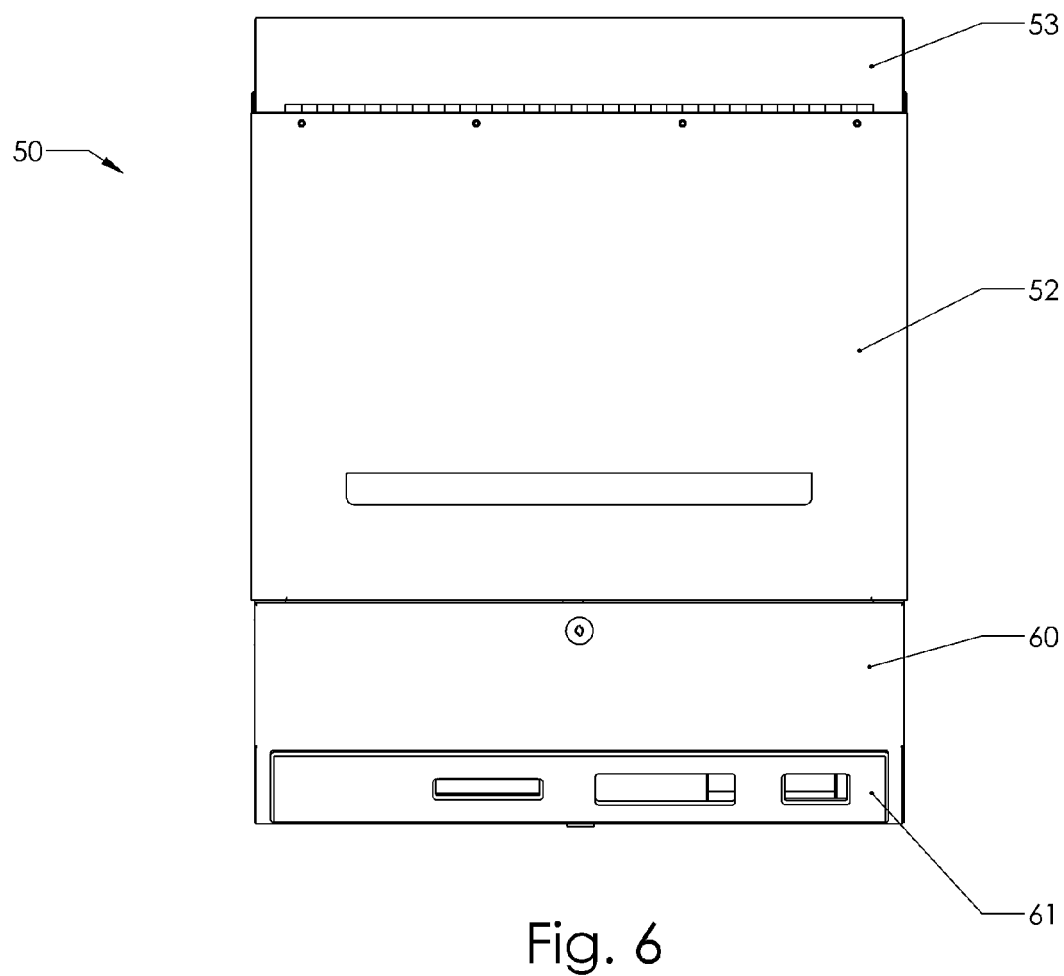
FIG. 6 is a top view of the computer-controlled, common access cabinet.
Figure 7:
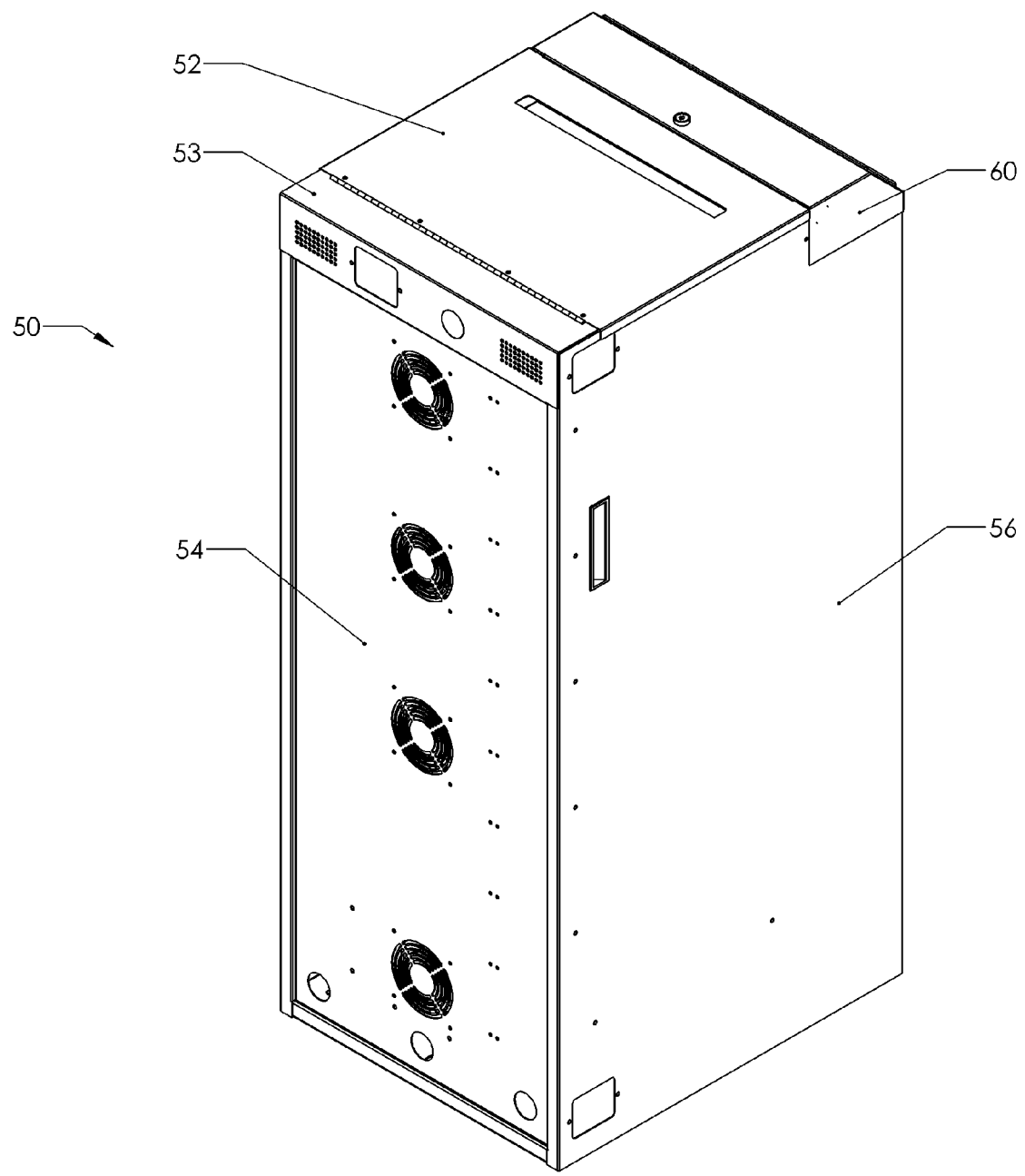
FIG. 7 is a perspective view of the computer-controlled, common access cabinet, the view showing the rear and left side of the cabinet.
Figure 8:
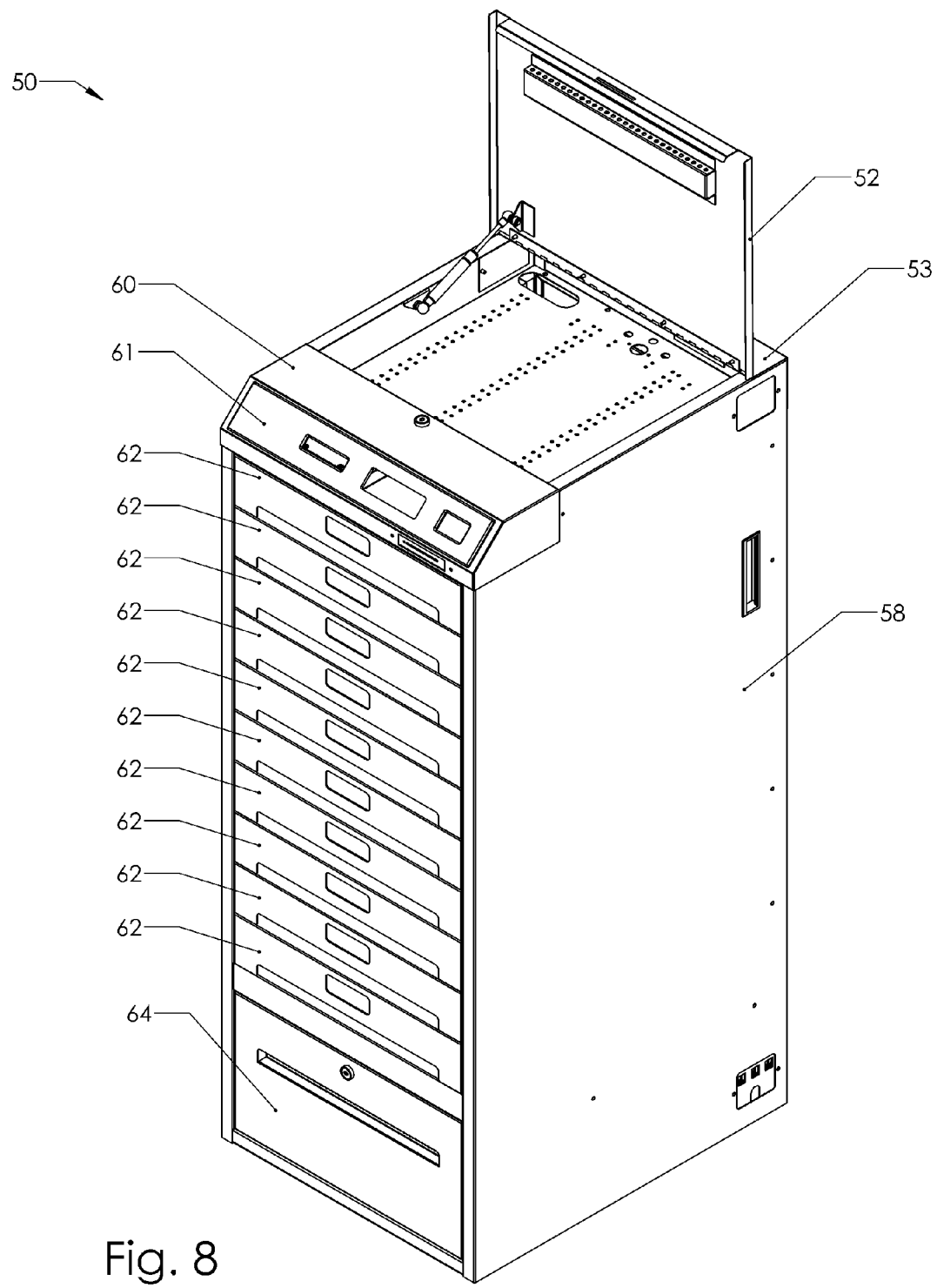
FIG. 8 is a perspective view of the computer-controlled, common access cabinet, the view showing the front and right side of the cabinet and a top panel in the open position.
Figure 9:
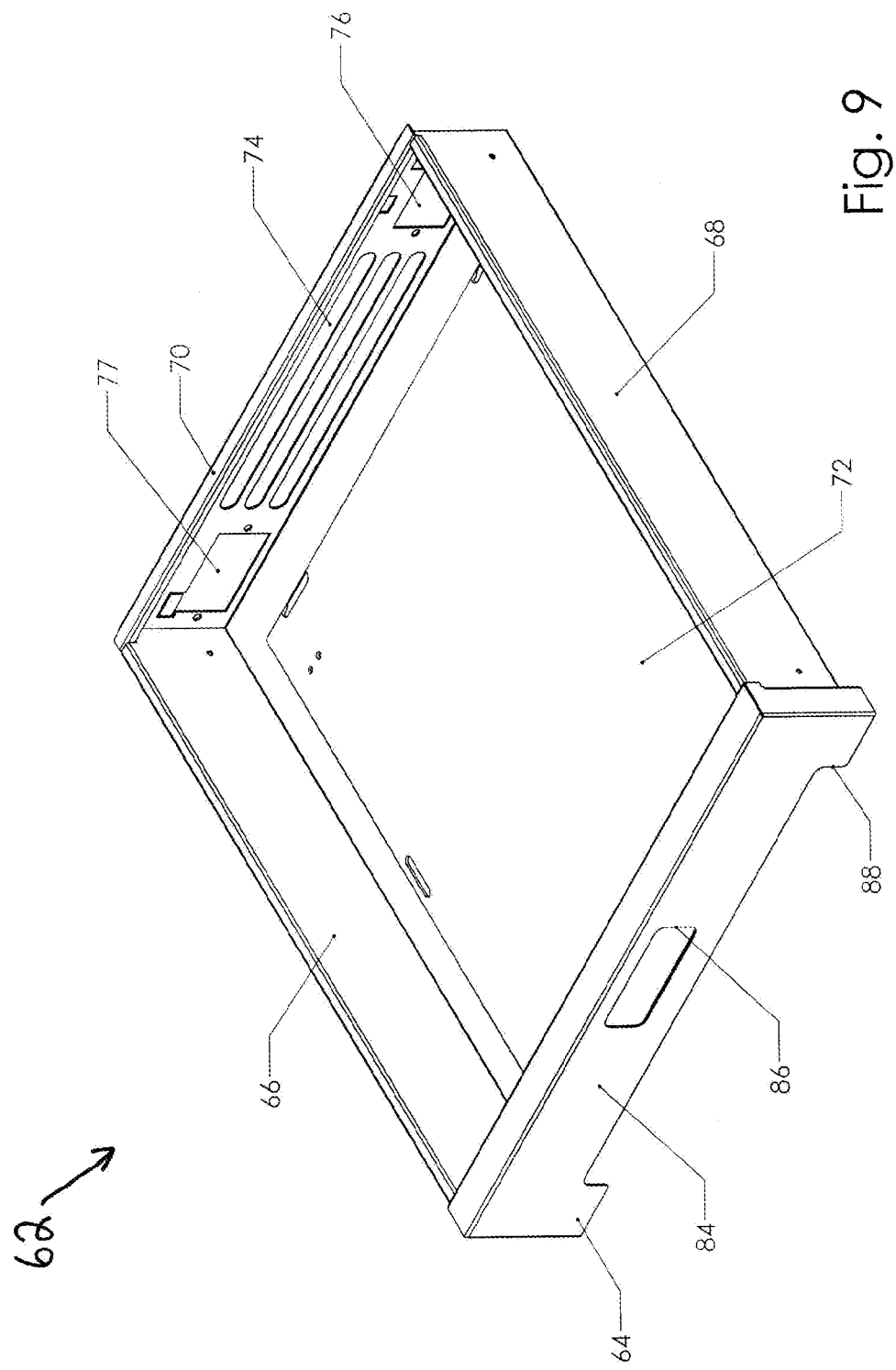
FIG. 9 is a perspective view of a cabinet drawer depicted in FIG. 1, the view showing the front and right side of the cabinet drawer.
Figure 10:
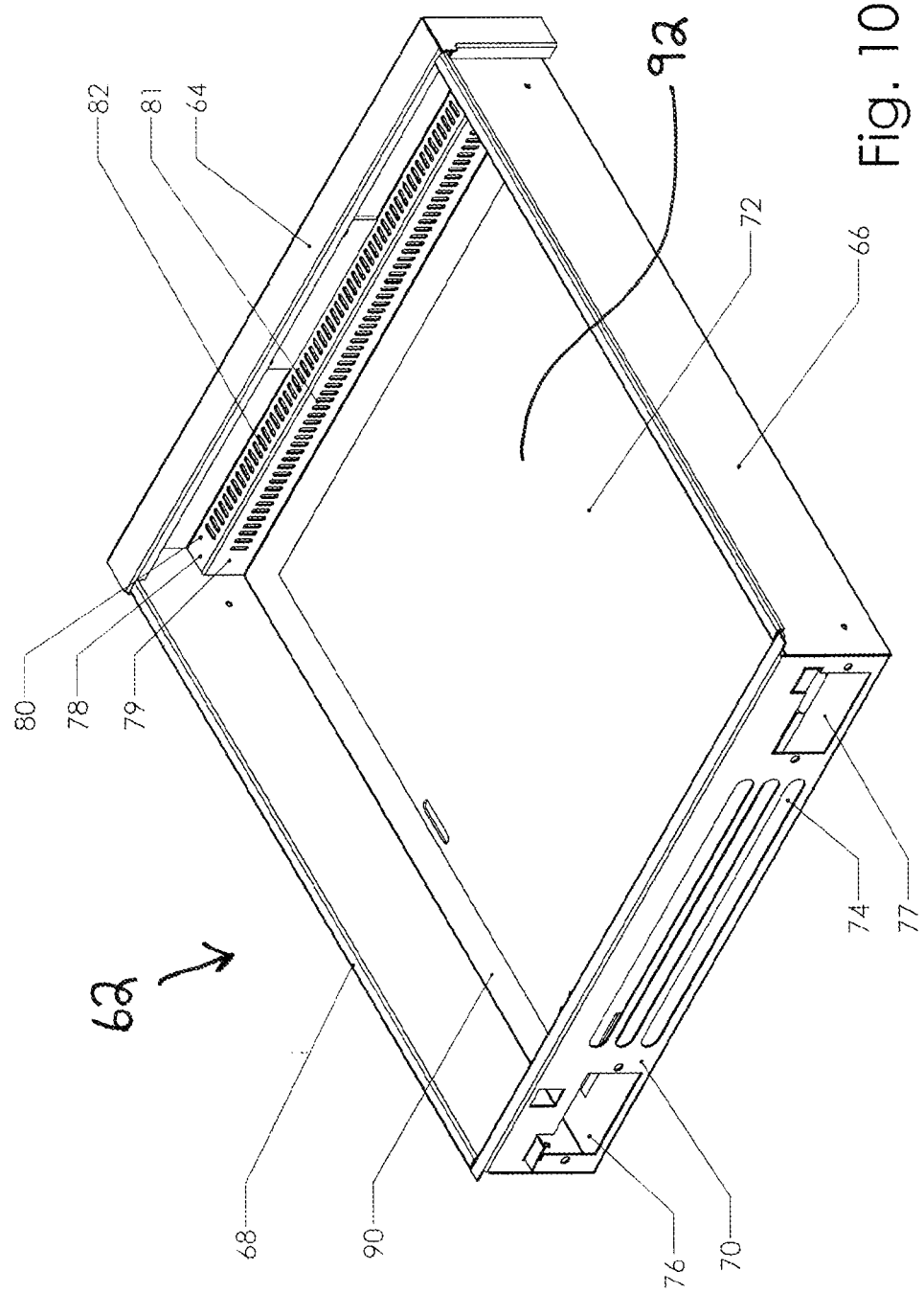
FIG. 10 is a perspective view of the cabinet drawer, the view showing the rear and left side of the cabinet drawer.

Referring to FIGS. 1-8, there is shown computer-controlled, common access cabinet 50 in accordance with one embodiment of the present invention. Cabinet 50 comprises movable top panel 52, rear corner section 53, rear panel 54, left side panel 56 and right side panel 58. Cabinet 50 also includes bottom panel 59. Rear corner section 53 is rigidly attached to rear panel 54 and side panels 56 and 58. Movable top panel 52 is movably attached to rear corner section 53. In one embodiment, a hinge, comparable to a piano hinge, is used to hingedly attach top panel 52 to rear corner section 53. Cabinet 50 further comprises section 60 that is positioned in front of movable top panel 52 and is attached to side panels 56 and 58. Section 60 includes control panel 61 which comprises a LCD display, keypad and several other ID card reader or scanner devices, all of which are discussed in the ensuing description. In order to facilitate viewing of the exterior of cabinet 50, many external components such as wires, cables, receptacles, connectors, etc. are not shown. Cabinet 50 further comprises a plurality of drawers 62 that are slidably mounted to cabinet 50 and slide between a closed position and an opened position. When drawers 62 are in the closed position, the drawers 62 are completely positioned within the interior of cabinet 50 and are locked. In a preferred embodiment, cabinet 50 includes door 64 which, when opened, allows access to a compartment that holds components of the electronic control system, described in the ensuing description, that is used to control the operation of cabinet 50. Such components include circuit boards, a computer or controller board, USB hubs, bus wires, driver circuitry, power supplies, A.C. and D.C. voltage distribution components, etc.

Figure 11:
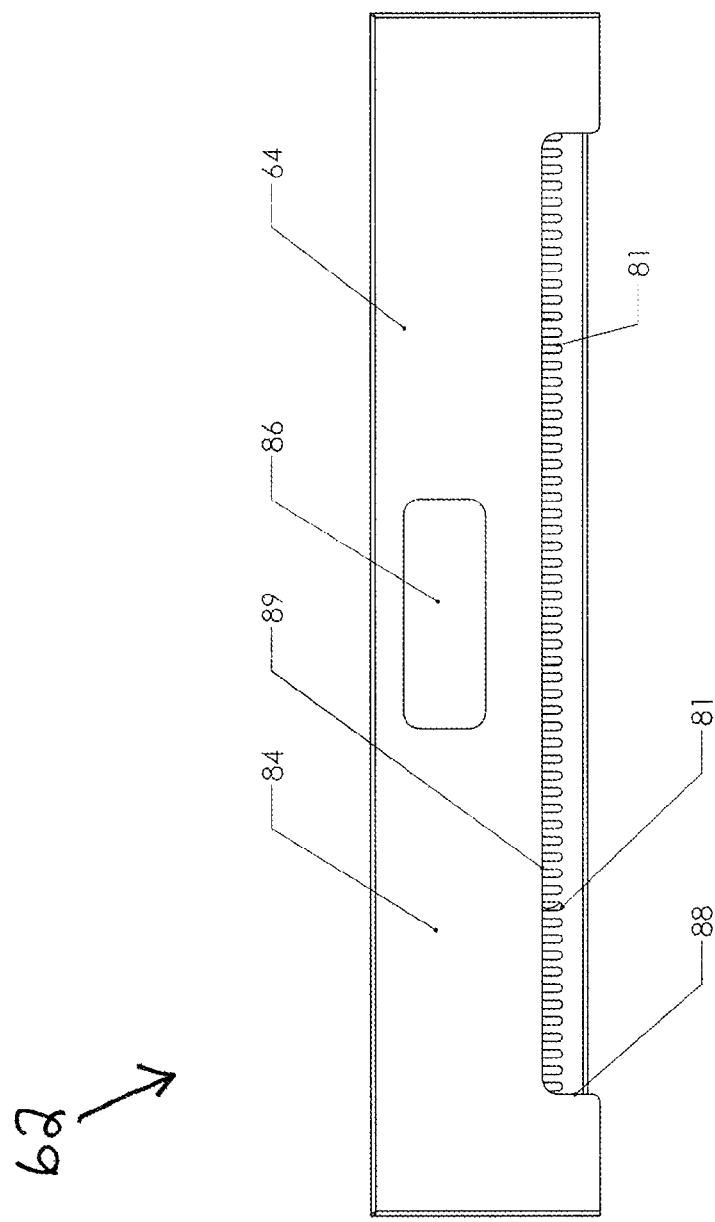
FIG. 11 is a front view of the cabinet drawer.
Figure 12:
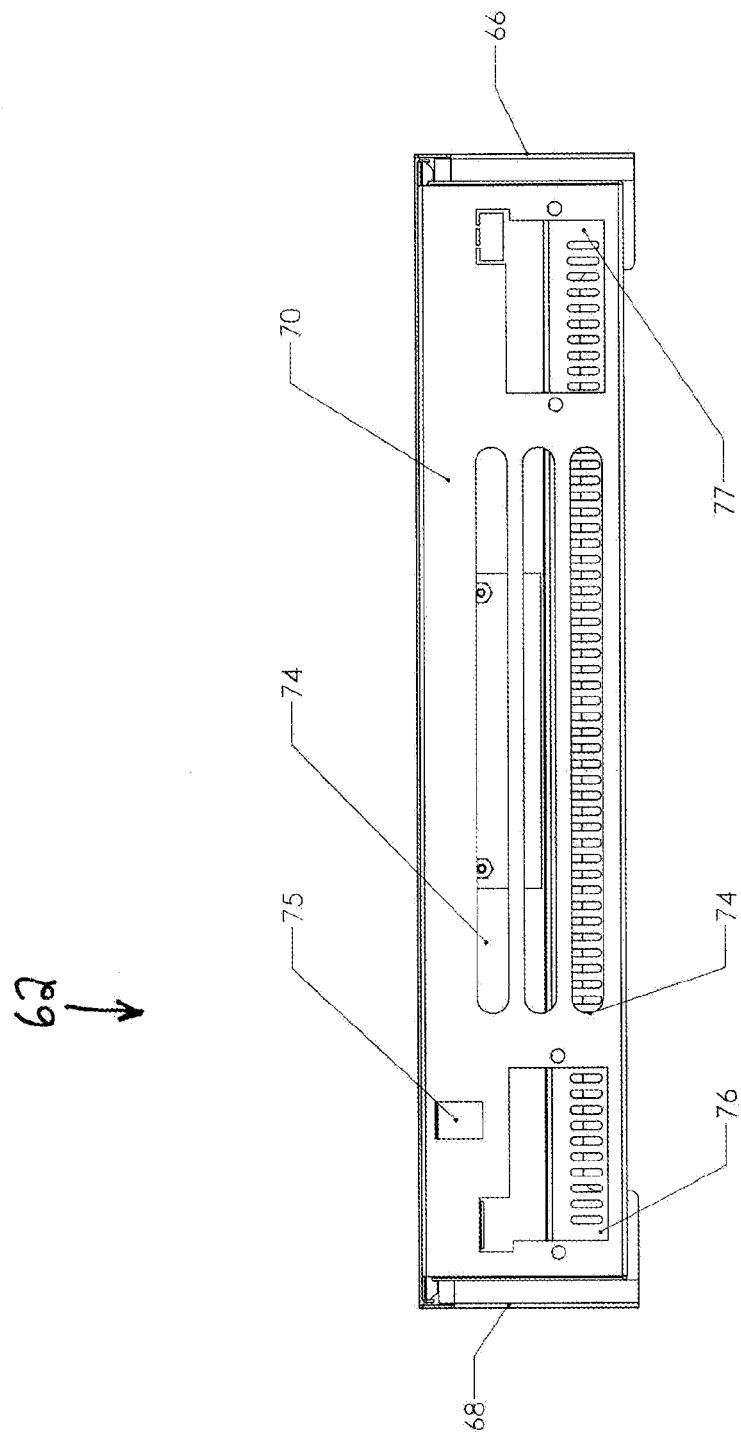
FIG. 12 is a rear view of the cabinet drawer.
Figure 13:
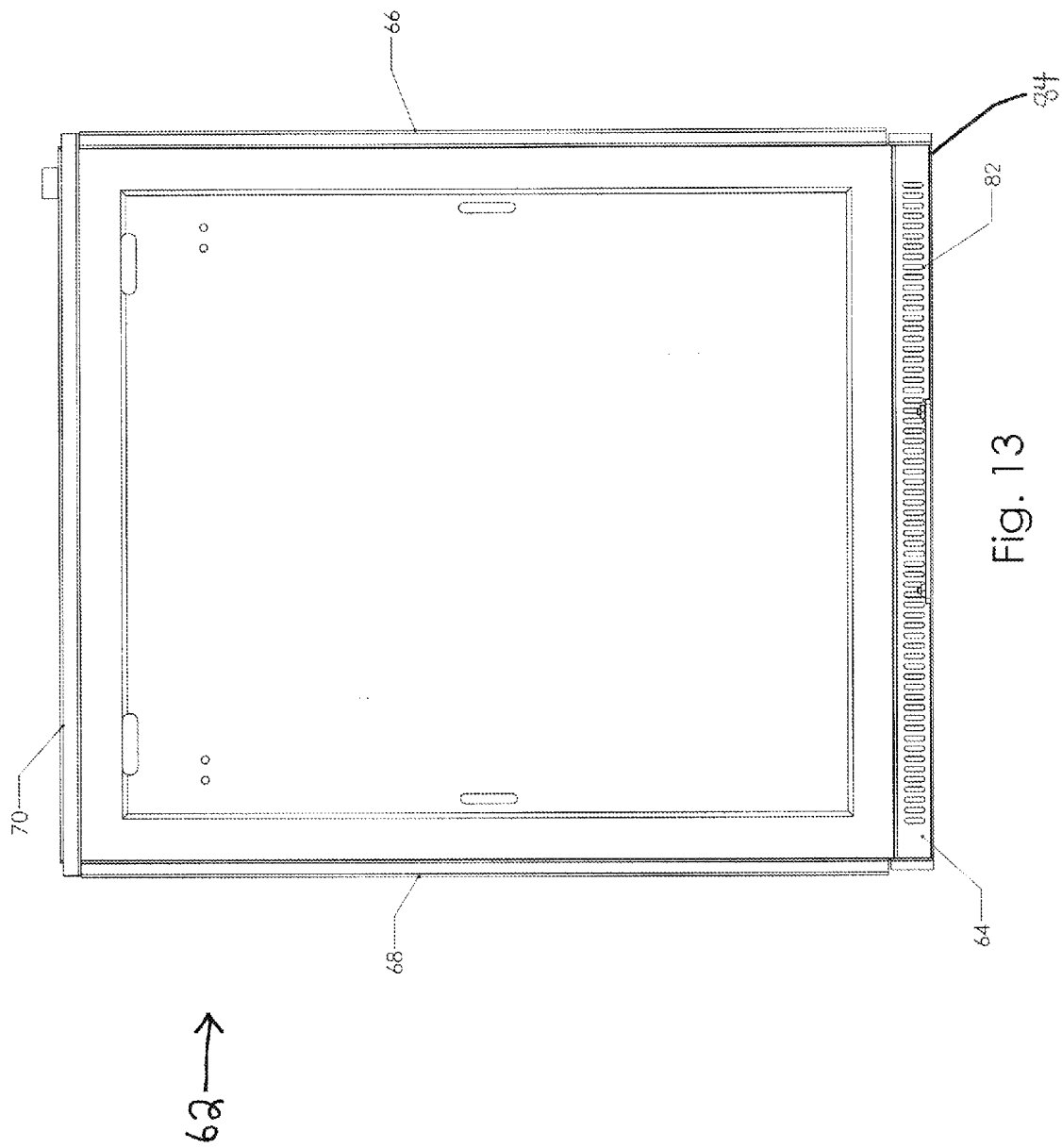
FIG. 13 is a bottom view of the cabinet drawer.
Figure 14:
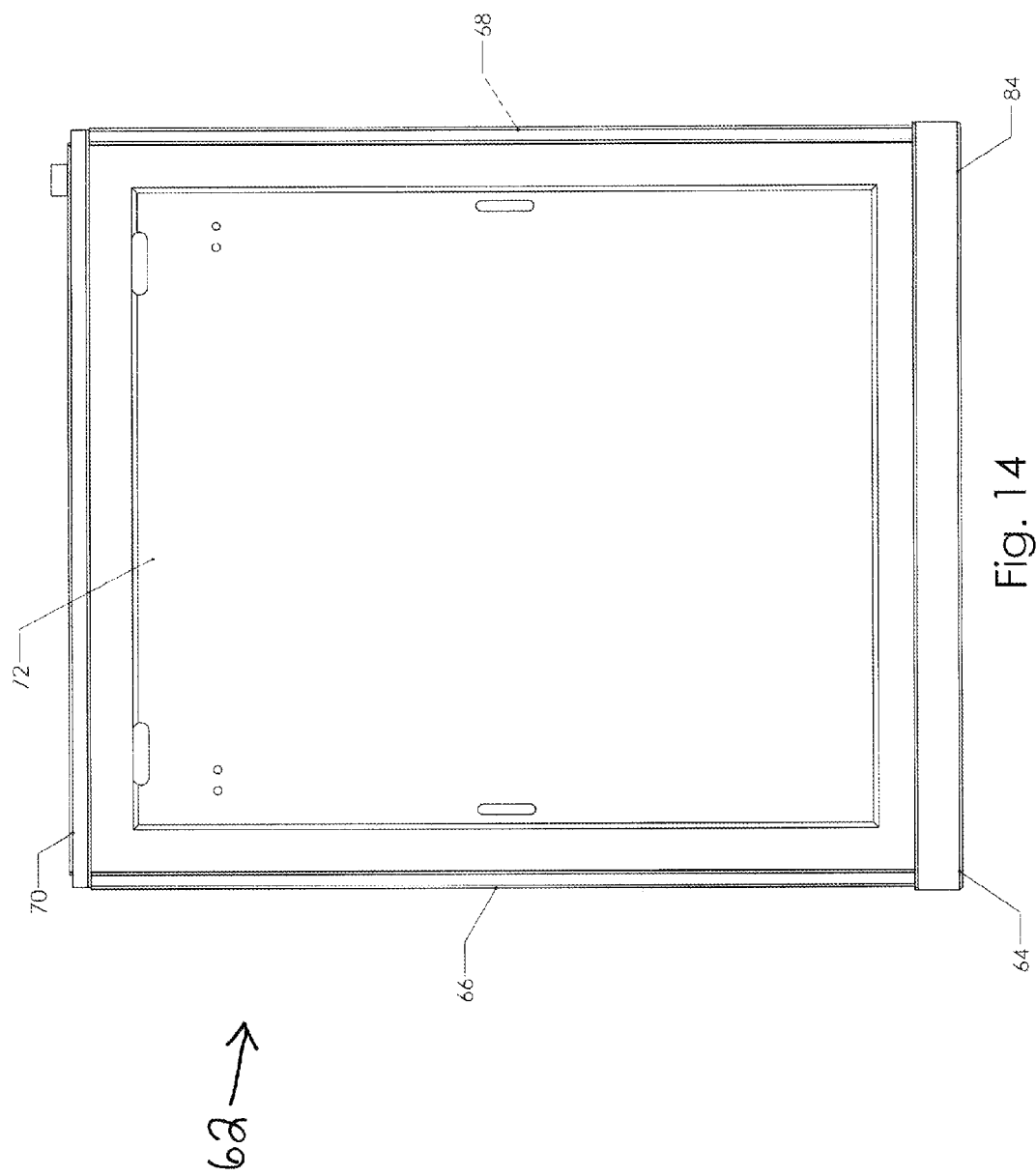
FIG. 14 is a top view of the cabinet drawer.
Figure 15:
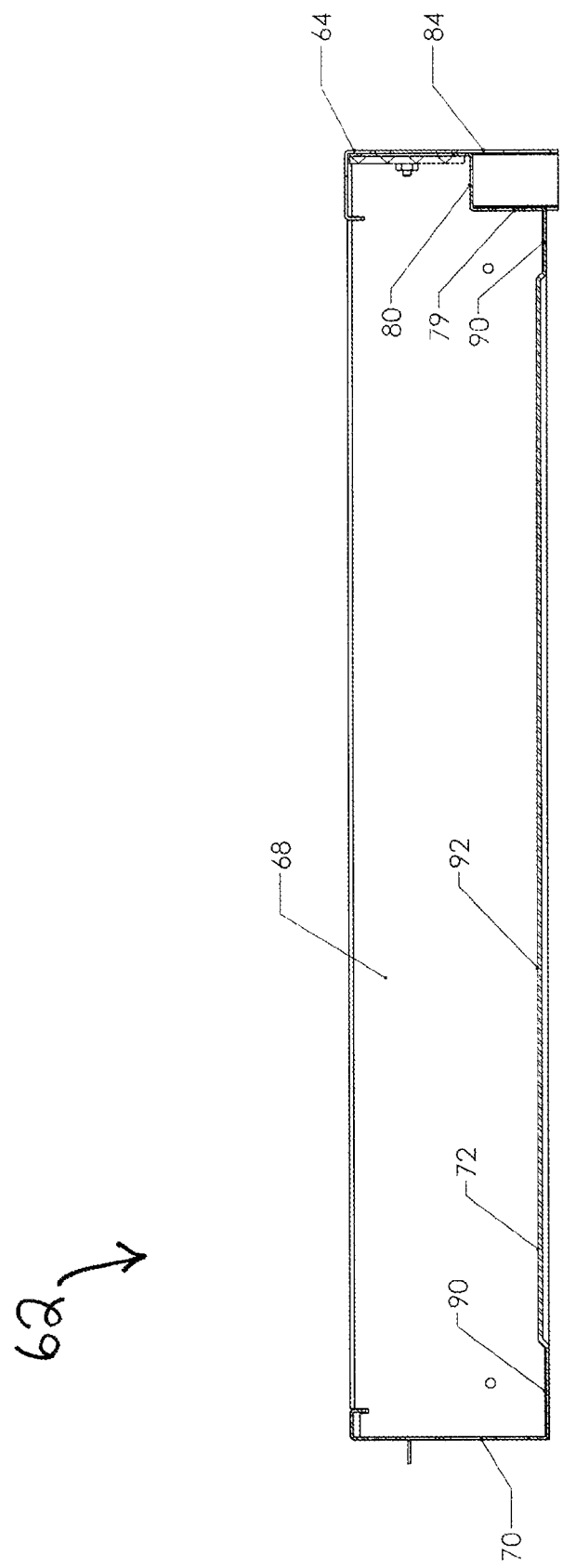
FIG. 15 is a cross-sectional view of the cabinet drawer.

Referring to FIGS. 9-15, each drawer 62 has a front section 64, sidewalls 66 and 68, rear wall 70 and bottom panel 72. Rear wall 70 has a plurality of vent slots 74, opening 76 and opening 77. Opening 76 is sized to receive a cable support plate or wire harness (not shown). Opening 77 is sized for receiving plate 106 (see FIGS. 18A and 18B), the purpose of which is discussed in the ensuing description. Drawer 62 includes a stepped portion 78 that is adjacent to front section 64. Stepped portion 78 comprises vertical section 79 and a horizontal section 80. Vertical section 79 has a plurality of vent slots 81. Similarly, horizontal section 80 has a plurality of vent slots 82. As shown in FIG. 11, front section 64 has an exterior side 84 and a window 86. Window 86 allows viewing of the interior of cabinet drawer 62. Exterior side 84 is configured to have an open area, indicated by reference number 88, which allows air to flow from vents 81 and 82 through open area 88. Open area 88 is bordered by edge 89 of front section 64. The open area 88 also allows a user to insert his fingers under edge 89 and pull the drawer outward or push the drawer inward. Bottom panel 72 comprises a peripheral portion 90 and a raised portion 92. Raised portion 92 receives a notebook, laptop computer or any device that is to be stored in drawer 62. The purpose of peripheral portion 90 is discussed in the ensuing description. The cabinet 50 includes a plurality of fans to cool the drawers. In one embodiment, there is a fan for every drawer 62 and each fan is positioned behind the drawer, in proximity to rear wall 70. Each fan produces airflow that flows through vents 74 in rear wall 70 and flows around and under the notebook computer or other device that is positioned upon raised portion 92 of bottom panel 72. The air then flows through vents 81 and 82 and through the open area 88 of front section 64. This feature is discussed in detail in the ensuing description. In an alternate embodiment, each fan corresponds to a group of drawers and functions to cool these drawers when the temperature exceeds a predetermined temperature.

Figure 16:
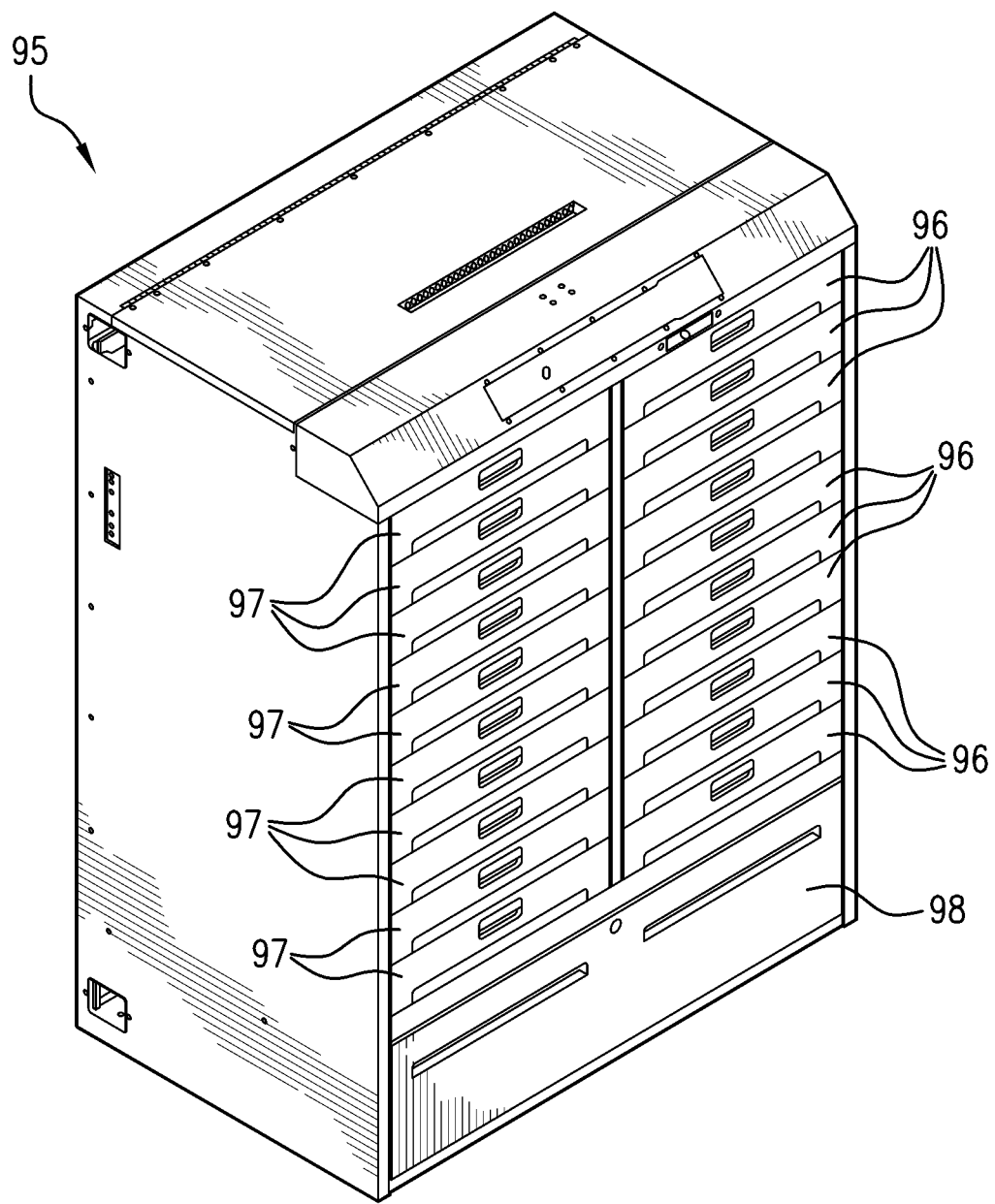
FIG. 16 is a perspective view of a computer-controlled common access cabinet in accordance with another embodiment of the present invention.

FIG. 16 shows multi-drawer cabinet 95 in accordance with another embodiment of the present invention. Cabinet 95 has a first column of drawers 96 and a second column of drawers 97. Each drawer 96 and 97 has substantially the same structure as cabinet drawer 62. Cabinet 95 also includes door 98 that provides access to a compartment that holds components of the control system that controls operation of cabinet 95, wherein such components include electronic circuit boards, a computer or controller board, power supplies, cables, driver circuit boards, USB hubs, USB cables, and other components.

Figure 17:
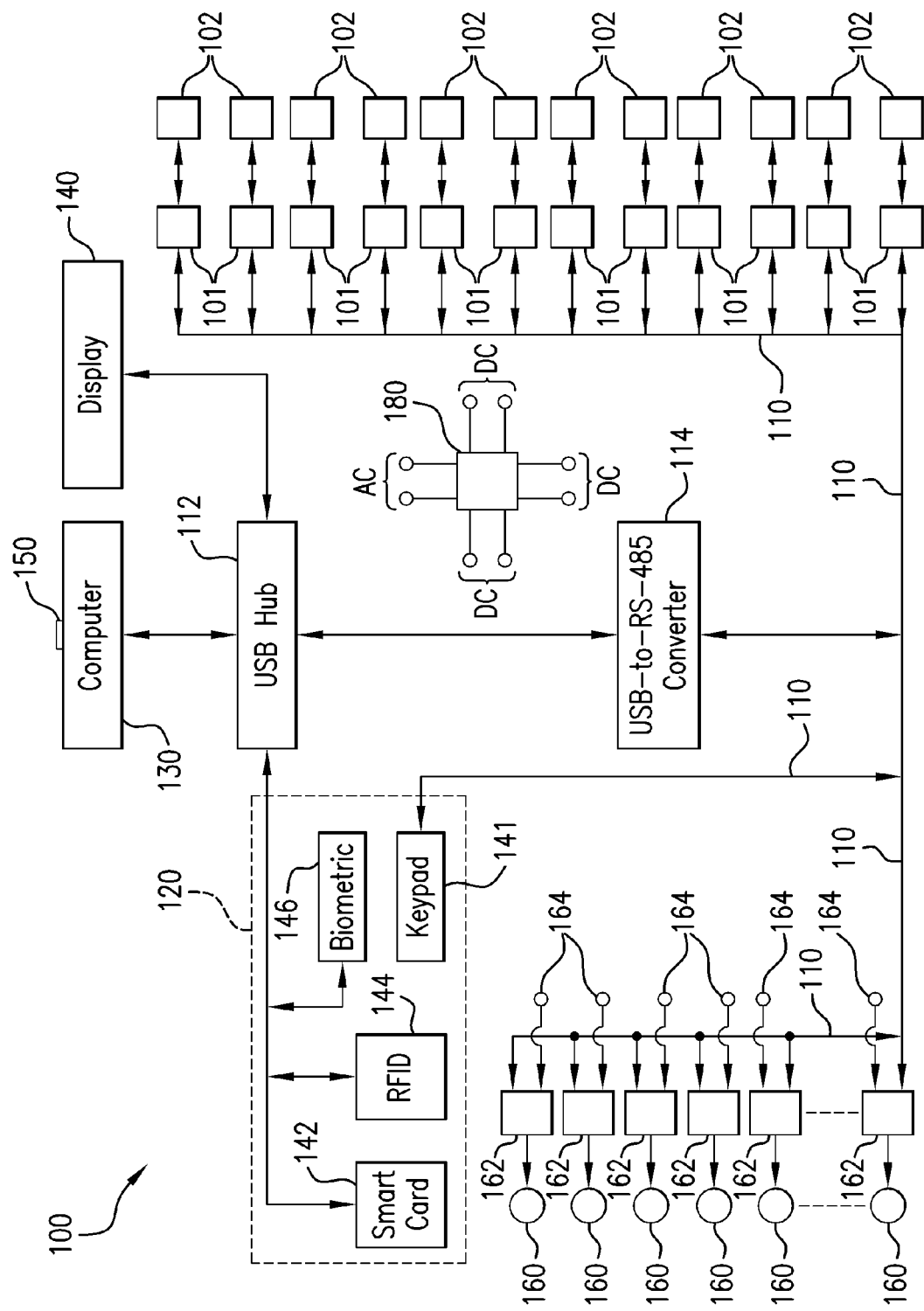
FIG. 17 is a block diagram of a control system of the computer-controlled common access cabinet in accordance with one embodiment of the present invention.
Figure 18A:
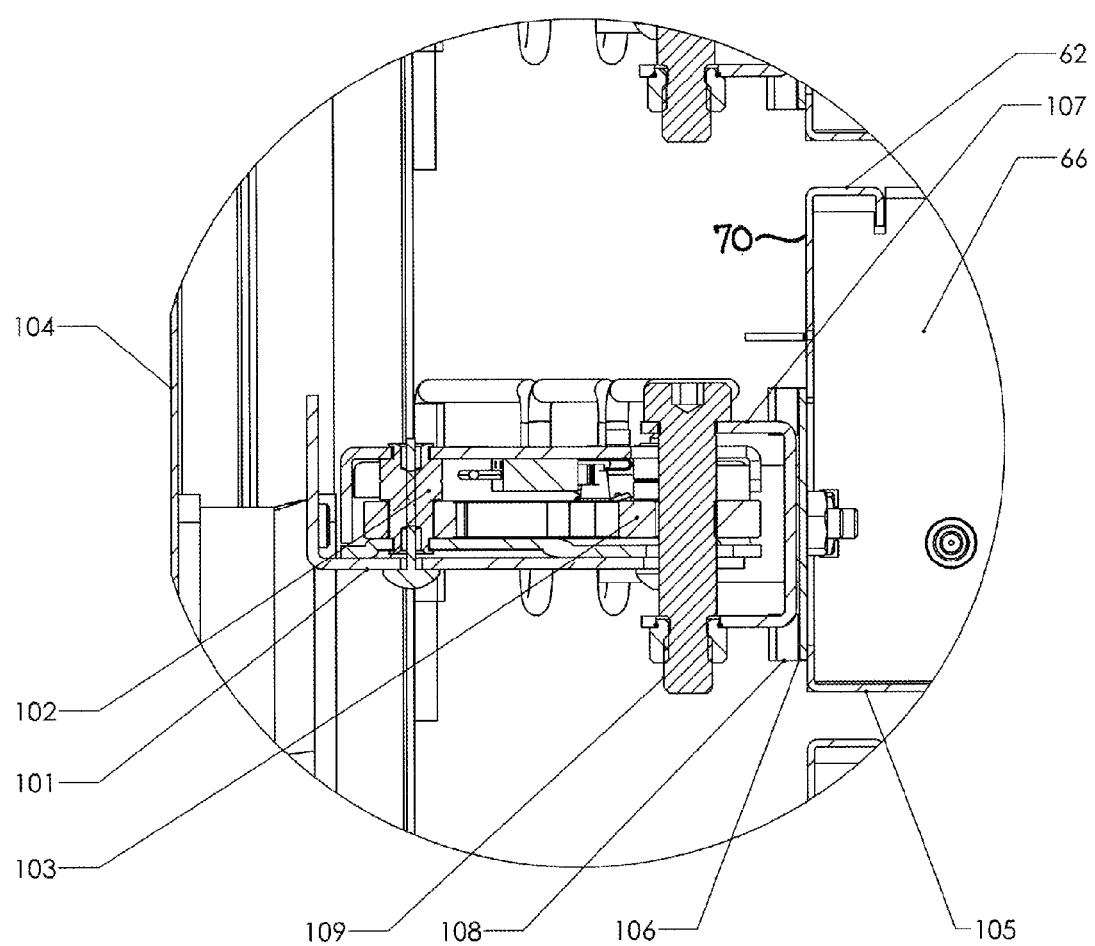
FIG. 18A is a side view, partially in cross-section, showing the positions of a cabinet drawer and a latch.
Figure 18B:
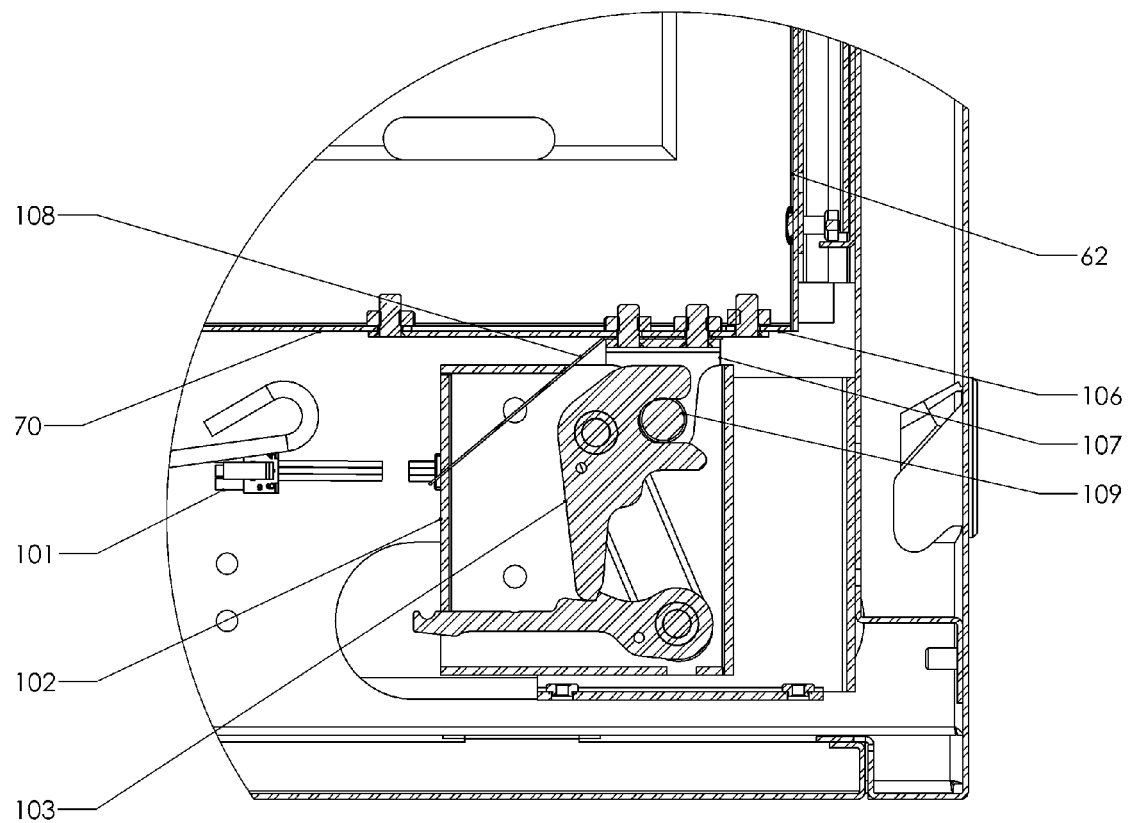
FIG. 18B is a diagrammatic plan view showing components on the rear wall of the cabinet drawer that interact with a corresponding latch.

Referring to FIG. 17, there is shown control system 100 for controlling the operation of multi-drawer, common access cabinet 50 in accordance with one embodiment of the present invention. Control system 100 comprises a plurality of latch control circuits 101 and electronic rotary latches 102. Each latch control circuit 101 is in electrical signal communication with a corresponding latch 102. Each latch control circuit 101 comprises electronic circuits and a data storage circuit that is configured to store a digital signal that represents a predetermined address assigned to the drawer 62 that corresponds to the latch control circuit 101. Each latch control circuit 101 is in electronic signal communication with RS-485 bus 110 which is described in the ensuing description. Latch control circuits 101 and the latches 102 are mounted within cabinet 50. In one embodiment, as shown in FIG. 18A, each latch 102 is attached to support structure 104 that is within and part of cabinet 50. Drawer 62 slides upon horizontal support member 105. Each latch 102 is positioned in proximity to the rear wall 70 of a corresponding cabinet drawer 62. Each latch 102 comprises movable latch member 103. As shown in FIG. 18A and 18B, each drawer 62 includes a plate 106 that is attached to rear wall 70 and covers opening 77. Bracket 107 and resilient member 108 are attached to plate 106. Resilient member 108 is between plate 106 and bracket 107. Vertical member 109 is attached to bracket 107. Each latch member 103 can be configured to a first position to engage or grasp vertical member 109 so as to lock drawer 62 and prevent it from being moved. The latch member 103 can be configured to a second position that releases vertical member 109 so as to allow drawer 62 to be pulled outward. When a latch control circuit 101 receives an electrical signal that defines a predetermined address that matches the address stored in the latch control circuit 101, the latch control circuit 101 outputs an electrical voltage (e.g. 24 VDC) to the corresponding latch 102 to cause latch member 103 to release vertical member 109 in order to unlock the corresponding drawer 62. The user can then pull drawer 62 outward. When the user is finished with his task, he closes drawer 62 and pushes it back into the cabinet 50. When drawer 62 is almost completely inserted into cabinet 50, vertical member 109 frictionally slides back into latch member 103 and the casing of latch 102 contacts resilient member 108. Resilient member 108 provides a certain amount of force on drawer 62 in order to prevent any type of play or slight movement of the drawer 62 when latch member 103 has completely grasped vertical member 109. Any suitable commercially available electronically controlled latch may be used. In one embodiment, each latch 102 comprises a commercially available electronic rotary latch manufactured by Southco, Inc. of Concordville, Pa., having part no. R4-EM-11-161.

Referring to FIG. 17, control system 100 further comprises asynchronous serial interface bus 110 that is in electronic signal communication with all of the latch control circuits 101. In one embodiment, asynchronous serial interface bus 110 is an RS-485 bus. Control system 100 further comprises USB hub 112 and USB-To-RS-485 converter 114. Converter 114 has an asynchronous serial interface port in electronic signal communication with asynchronous serial interface bus 110. Converter 114 has a USB signal port in electronic signal communication with USB hub 112. Converter 114 converts USB signals, which are received at its USB signal port, into asynchronous serial data signals. Converter 114 also converts asynchronous serial data signals, which are received at its asynchronous serial interface port, into USB signals. Control system 100 comprises user input device 120 which is in electronic signal communication with USB hub 112 and is configured to receive user identification data inputted by a user. The user identification data identifies the user and the cabinet drawer 62 (or drawers) to which the user is authorized to access. User input device 120 is described in detail in the ensuing description.

Referring to FIG. 17, control system 100 further comprises computer 130 which is in electronic signal communication with USB hub 112. Computer 130 processes the user identification data to determine if the user identification data is valid and whether the user is authorized to access any of cabinet drawers 62. Computer 130 comprises a programmable microprocessor, random access memory, read-only-memory, drivers and additional data storage devices for storing therein user identification data and data identifying the cabinet drawers 62 to which a user is entitled to access. Computer 130 also has a USB port for outputting latch control signals. Computer 130 also stores the predetermined, unique address of each of the drawers 62. Since each latch control circuit 101 and latch 102 correspond to a particular drawer 62, each latch control circuit 101 also stores the address assigned to that particular corresponding drawer 62 as described in the foregoing description. The USB port of computer 130 is in electronic signal communication with USB hub 112. Computer 130 is programmed to output latch control signals that cause one or more latches 102 to unlock one or more cabinet drawers 62 in accordance with valid user identification data. Each latch control signal contains a predetermined, unique address that corresponds to the drawer 62 that is to be unlocked. As described in the foregoing description, only a latch control circuit 101 having that particular address stored therein will respond to that latch control signal. The latch control signals are inputted into USB hub 112 and then routed to converter 114 wherein the latch control signals are converted to asynchronous serial signals. These asynchronous serial signals are then routed to the asynchronous serial interface bus 110 which is in electronic signal communication with all latch control circuits 101. Since each latch control signal contains a particular latch address, only the latch control circuit 101 having that particular address will respond to the latch control signal as described in the foregoing description. Other functions of computer 130 include rebooting, initializing or initiating procedures, and the control of fans that cool the interior of the drawers. The fan-control feature is discussed in detail in the ensuing description.

Referring to FIG. 17, control system 100 further comprises display device 140 that is in electronic signal communication with USB hub 112. Data displayed on display device 140 is generated by computer 130. Display device 140 displays to the user data entry queues and commands which inform the prospective user as to what information the user should input. Display device 140 also displays messages relating to the validity of the user identification data inputted by the user and whether access is authorized or denied. In one embodiment, display device 140 comprises an LCD display. Display device 140 is described in detail in the ensuing description.

Referring to FIG. 17, in a preferred embodiment, user input device 120 comprises keypad 141 which is in electronic data signal communication with asynchronous serial interface bus 110. User input device 120 further comprises smart card reader 142, RFID card reader 144 and biometric reader 146 which are all in electronic data signal communication with USB hub 112. Computer 130 may be programmed to implement any one of a number of access protocols. These protocols are as follows:

1) KEYPAD ONLY: A user is granted access by using keypad 141 only and entering a valid PIN (personal identification number) code and then typing "ENTER". In a preferred embodiment, the PIN code is between 4 and 20 digits.

2) SMART CARD and KEYPAD: A user is granted access by using keypad 141 and Smart Card (e.g. memory card) reader 142. In this protocol, in order to be granted access, a user must insert a valid Smart Card (e.g. memory card) into Smart Card reader 142 and enter a valid PIN code into keypad 141.

3) BIOMETRIC READER and KEYPAD: An authorized user is granted access by swiping his finger over biometric reader 146 and inputting a PIN code via keypad 141.

4) RFID CARD ONLY: An authorized user is granted access by holding his Radio Frequency Identification card or tag near RFID Card Reader 144. RFID Card Reader 144 automatically reads the card and computer 130 implements a search of its stored user identification data for the user. If computer 130 finds the user, then computer 130 issues a latch control signal that results in the opening of the drawer 62 to which that user is authorized to have access.

In a further embodiment, user input device 120 further comprises a card reader that is configured to read government issued DoD-CAC cards (or PIV cards). In such an embodiment, the card reader is used in conjunction with keypad 141. Thus, in addition to the user placing his DoD-CAC card near the card reader, the user must also punch in a valid PIN code using keypad 141.

In an alternate embodiment, user input device 120 is not in electronic signal communication with USB hub 112 but instead, is in direct electronic signal communication with a USB port of computer 130.

As described in the foregoing description, display device 140 displays data entry queues and commands that inform the user of the information that the user must input into user input device 120. Display device 140 also displays messages relating to the validity of the user identification data inputted by the user and whether access to the cabinet drawer is authorized or denied. For example, display device 140 can display the following messages:

a) "Input PIN Code"
b) "Swipe Card"
c) "Invalid PIN Code"
d) "Re-type PIN Code"
e) "Invalid Card"
f) "Authorized Access"
g) "Access Denied"

These messages are just some examples. Computer 130 may be programmed to cause display device 140 to display other messages and information as well.

Referring to FIG. 17, computer 130 includes a data communication port 150 that is configured to link computer 130 to a network that is in data communication with a remote computer or database. Such a remotely located computer can program or re-program computer 130 with updated user identification data. In a preferred embodiment, data communication port 150 comprises an Ethernet port.

At any time, additional users may be added to the group of users that are authorized to have access to the cabinet drawers. This may be accomplished by one of two methods. The first method to add new users is through an Auto-Add mode that is implemented by computer 130. In the Auto-Add mode, a user inserts his or her DoD-CAC card into Smart Card Reader 142. Display device 140 then asks the user for the DoD-CAC PIN. The user would then enter the PIN into keypad 141. Computer 130 processes this information to determine if this user is a new user. If computer 130 determines that this user is a new user, computer 130 automatically adds this new user to the local system data base, which is part of computer 130. If the user is entitled to access a cabinet drawer, then computer 130 issues the appropriate control signal to unlock that cabinet drawer.

The second method to add a new user to the group of authorized users is through a cabinet administrator. Typically, in this scenario, the cabinet administrator is not located at the same location as the cabinet, and cabinet computer 130 is in electronic data communication with the cabinet administrator's computer via a network (e.g. Ethernet). This method requires the cabinet administrator to run a specialized software application on his or her computer with a card reader connected to the administrator's computer. Numerous "new user" data fields appear on the display screen of the cabinet administrator's computer. The cabinet administrator uses his or her keyboard to enter various data into the "new user" data fields to create a "pseudo-name" account for the new user, so as not to use any of the new user's personal information. The software application then asks the user to slide his or her card through the card reader and to provide the user's CAC PIN. After sliding his or her card through the card reader, the new user then enters his or her PIN using the cabinet administrator's keyboard. The software application reads various strings of data from the CAC card and then creates a unique "Matching ID" for that CAC card. The "Matching ID" does not contain any data or PINS read from the CAC card. The cabinet administrator then logs onto the computer (e.g. computer 130) of the remotely located cabinet and loads this new user pseudo-name data and "Matching ID" into computer 130. The cabinet is now ready for this new user.

As described in the ensuing description, if a user is authorized to have access to any of the drawers, computer 130 issues a control signal that causes the particular drawer to be unlocked. After the user is finished with his task, he closes the cabinet drawer. When the user completely closes drawer 62, latch member 103 grasps or engages vertical member 109 thereby locking the drawer 62. When the latch 102 locks the drawer 62, latch control circuit 101 outputs a latch status signal that is routed to converter 114 via asynchronous serial interface bus 110. This latch status signal indicates the drawer 62 is now locked. Converter 114 converts the latch status signal into a USB signal which is inputted into USB hub 112. The latch status signal is then inputted into computer 130. Computer 130 then updates the status of the latch 102. The only way the user can reopen the drawer 62 is for the user to again input his user identification data into user input device 120.

Referring to FIG. 17, control system 100 further comprises a fan system that comprises a plurality of fans 160. In one embodiment, there is one fan 160 for every drawer 62. In such an embodiment, each fan 160 is located in proximity to the rear wall 70 of each corresponding drawer 62. Specifically, each fan 160 is attached to an interior structure or interior wall of cabinet 50 so that it is in proximity to the rear of a corresponding cabinet drawer 62. Each fan 160 produces airflow that passes through vent slots 74 in rear wall 70 of drawer 62 and into the interior of drawer 62. The air flows through drawer 62 and exits vents 81 and 82 in the front of drawer 62. The airflow cools the interior of the drawer. The fan system further comprises a plurality of fan control circuits 162. Each fan control circuit 162 corresponds to a particular fan 160 and comprises electronic circuitry for storing data signals generated by the computer 130 and for controlling the operation of its corresponding fan. Each fan control circuit 162 is in electronic signal communication with the asynchronous serial interface bus 110. Each fan control circuit 162 receives data signals that originate from computer 130. Such data signals define predetermined "ON" and "OFF" temperature set points. The fan system further comprises a plurality of temperature sensing devices 164. Each temperature sensing device 164 is in electronic signal communication with a corresponding fan control circuit 162. In a preferred embodiment, each temperature sensing device 164 is attached to the peripheral portion 90 of bottom panel 72 of drawer 62. In an alternate embodiment, each temperature sensing device 164 is located within a corresponding drawer 62 and attached to either sidewall 66 or sidewall 68. Each temperature sensing device 164 outputs electronic signals representing the temperature within that cabinet drawer 62. The electronic signals outputted by each temperature sensing device 164 are inputted into a corresponding fan control circuit 162. The electronic signals outputted by each temperature sensing device 164 represent the sensed or measured temperature. If the measured temperature is above the predetermined "ON" temperature set point, the fan control circuit 162 generates a control signal that initiates operation of the corresponding fan 160. If the measured temperature is below the predetermined "OFF" temperature set point, the fan control circuit 162 generates a control signal that turns off the corresponding fan 160. Each fan control circuit 162 effects initiation, continuation or cessation of the operation of its corresponding fan 160, depending upon the temperatures measured by its corresponding temperature sensing devices 164. Thus, each fan 160 is controlled independently. If the temperature in one drawer 62 is above the predetermined "ON" temperature set point, but the temperatures in the other drawers are below the predetermined "ON" temperature set point, then the fan control circuit 162 corresponding to the drawer 62 with the high temperature outputs a control signal to initiate operation of the fan 160 that corresponds to the drawer 62 with the high temperature therein. If the temperature in the remaining drawers 62 remains below the predetermined "ON" temperature set point, then the other fan control circuits 162 do not initiate operation of the fans 160 that correspond to the remaining cabinet drawers 62.

In an alternate embodiment, there is not a separate fan 160 for each drawer 62, but instead, each fan 160 is assigned to a group of drawers 62. In such an embodiment, the fan 160 is activated when any of the temperature sensing devices 164 in the group of drawers measures a temperature that is above the predetermined "ON" temperature set point. In such an embodiment, each fan 160 has a sufficient capacity to produce airflow for a group of drawers 62.

In an alternate embodiment, temperature sensors are not positioned with in each drawer but, instead, are placed a different locations within the interior of cabinet 50.

As shown in FIG. 17, control system 100 includes power supply 180 which provides predetermined D.C. voltages to the components of control system 100. Specifically, power supply 180 converts an input A.C. voltage into one or more D.C. voltages that are used to power the computer 130, latch control circuits 101, fan control circuits 162, the components of user input device 120, display device 140, converter 114, USB hub 112 and other components.

Figure 19:
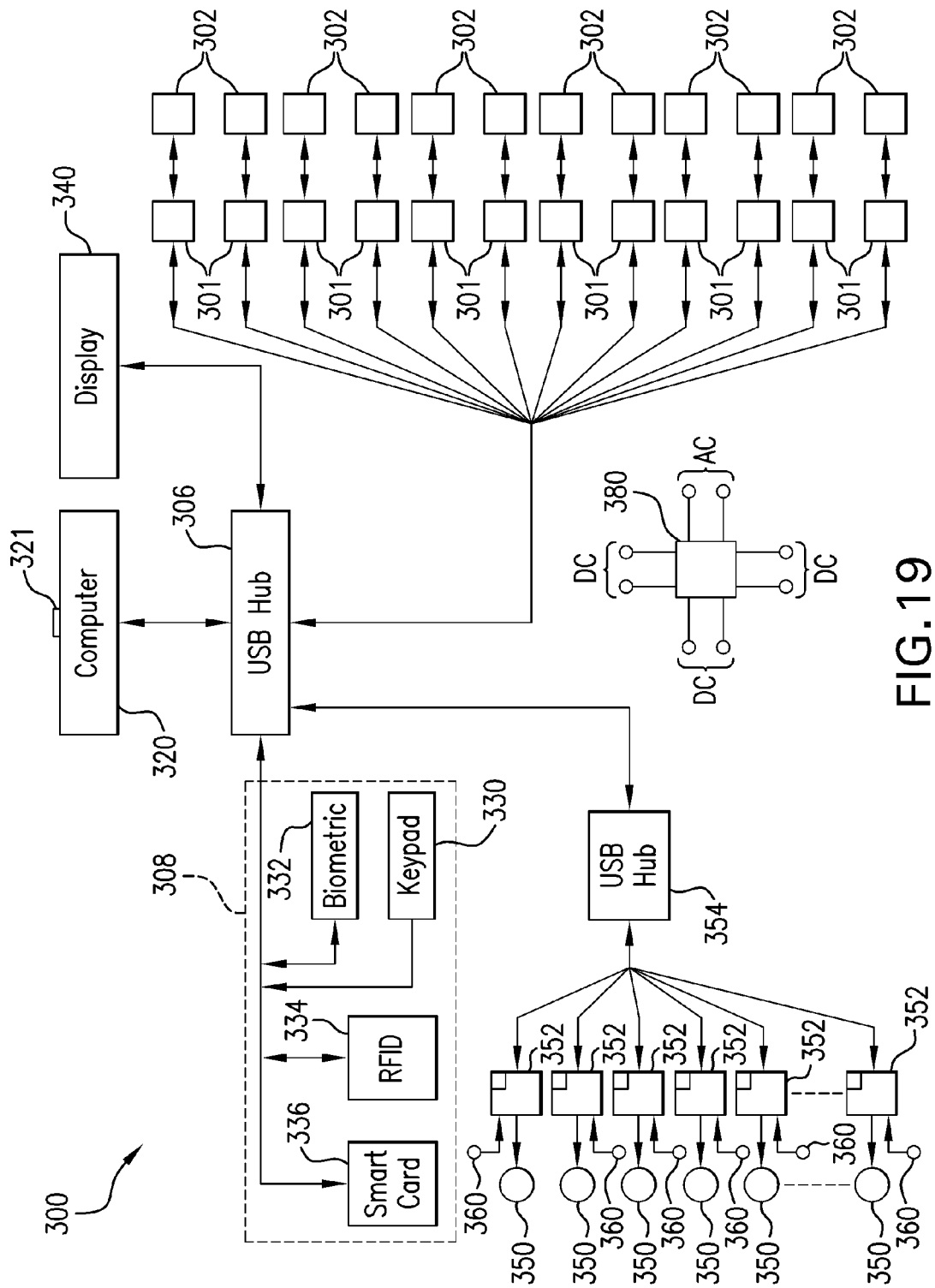
FIG. 19 is a block diagram of a control system of the computer-controlled common access cabinet in accordance with another embodiment of the present invention.

Referring to FIG. 19, there is shown control system 300, in accordance with another embodiment of the present invention, for controlling the operation of cabinet 50. Control system 300 comprises a plurality of latch control circuits 301 and electronic rotary latches 302. Each latch control circuit 301 is in electrical signal communication with a corresponding latch 302. Each latch control circuit 301 comprises electronic circuitry that can store a digital signal that represents the predetermined address assigned to the drawer 62 that corresponds to the latch control circuit 301. Each latch control circuit 301 is in electronic signal communication with USB hub 306 which is described in the ensuing description. Latch control circuits 301 and latches 302 are mounted within cabinet 50 in a manner similar to latch control circuits 101 and latches 102 described in the foregoing description (see FIGS. 18A and 18B). Each latch 302 is positioned in proximity to the rear wall 70 of a corresponding drawer 62. Each latch 302 has generally the same configuration as latch 102 and comprises a movable latch member, not shown but similar to latch member 103 of latch 102. The latch member of latch 302 performs the same function as latch member 103. Each latch control circuit 301 comprises a USB port to receive USB signals. When a latch control circuit 301 receives an electrical signal that has a predetermined address that matches the address stored in latch control circuit 301, that latch control circuit 301 outputs an electrical voltage signal (e.g. 24 volts D.C.) to the corresponding latch 302 to cause its latch member to disengage vertical member 109 of the corresponding cabinet drawer 62 so as to unlock that drawer 62. When the user is finished with his task, he closes drawer 62. When the drawer 62 is completely closed, the corresponding latch 302 engages and locks the drawer 62 in the same manner as latch 102 described in the foregoing description. Any suitable commercially available electronically controlled latch may be used. In one embodiment, each latch 302 comprises a commercially available electronic rotary latch manufactured by Southco, Inc. of Concordville, Pa., having Part No. R4-EM-11-161. As shown in FIG. 19, USB hub 306 is in electronic signal communication with all of latch control circuits 301.

Referring to FIG. 19, control system 300 further comprises user input device 308. In this embodiment, user input device 308 is in electronic signal communication USB hub 306. However, in an alternate embodiment, user input device 308 is in direct electronic signal communication with computer 320, which is discussed in the ensuing description. User input device 308 is configured to enable a prospective user of cabinet 50 to input user identification data. As described in the foregoing description, the user identification data identifies the user and the cabinet drawer or drawers to which the user is authorized to access. User input device 308 is discussed in detail in the ensuing description.

Referring to FIG. 19, control system 300 further comprises computer 320 which is in electronic signal communication with USB hub 306. Computer 320 has many functions, one of which is to process the user identification data to determine if the user identification data is valid and whether the user is authorized to access any of cabinet drawers 62. Computer 320 comprises a programmable microprocessor, random access memory, read-only-memory, drivers and additional data storage devices for storing therein user identification data and data identifying the cabinet drawers 62 to which a user is entitled to access. Computer 320 also stores the predetermined, unique address assigned to each drawer 62. Since each latch control circuit 301 and latch 302 correspond to a particular drawer 62, the latch control circuit 301 also stores the address assigned to that particular drawer 62.

Computer 320 is programmed to output latch control signals that control one or more latches 302 to selectively unlock any number of the cabinet drawers 62 in accordance with valid user identification data. The latch control signals are inputted into USB hub 306 which is in electronic signal communication with all of the latch control circuits 301. Each latch control signal has a predetermined address that corresponds to a particular drawer 62. Thus, only the latch control circuit 301 having that particular address stored therein will respond to the latch control signal. Other functions of computer 320 include rebooting, initializing or initiating procedures, processing of updated user identification data and the control of fans that cool the interior of the drawers 62. The fan-control feature is discussed in detail in the ensuing description. Computer 320 also includes a data communication port 321 which is configured for data communication with a computer network. Such a configuration enables computer 320 to receive updated user identification data from a remote computer or database. In a preferred embodiment, data communication port 321 is an Ethernet port.

Referring to FIG. 19, in a preferred embodiment, user input device 308 comprises keypad 330, biometric reader 332, RFID card reader 334 and smart card reader 336, all of which being in electronic signal communication with USB hub 306. In an alternate embodiment, user input device 308 is in direct electronic signal communication with computer 320.

Computer 320 may be programmed to implement any one of a number of access protocols. These protocols are as follows:

1) KEYPAD ONLY: A user is granted access by using keypad 330 only and entering a valid PIN (personal identification number) code and then typing "ENTER". In a preferred embodiment, the PIN code is between 4 and 20 digits.
2) SMART CARD and KEYPAD: A user is granted access by using Smart Card (e.g. memory card) reader 336 and keypad 330. In this protocol, in order to be granted access, a user must insert a valid Smart Card (e.g. memory card) into Smart Card reader 336 and enter a valid PIN code into keypad 330.
3) BIOMETRIC READER and KEYPAD: An authorized user is granted access by swiping his finger over biometric reader 332 and inputting a PIN code via keypad 330.
4) RFID CARD ONLY: An authorized user is granted access by holding his Radio Frequency Identification card or tag near RFID Card Reader 334. RFID Card Reader 334 automatically reads the card and computer 320 implements a search of its stored user identification data for the user. If computer 320 finds the user, then computer 320 issues a latch control signal that opens the cabinet drawer 62 to which that user is authorized to have access.

In a further embodiment, user input device 308 further comprises a card reader that is configured to read government issued DoD-CAC cards (or PIV cards). In such an embodiment, the card reader is used in conjunction with keypad 330. Thus, in addition to the user placing his DoD-CAC card near the card reader, the user must also punch in a valid PIN code using keypad 330.

Referring to FIG. 19, control system 300 further comprises display device 340 which is in electronic signal communication with USB hub 306. Data displayed on display device 340 is generated by computer 320. In a preferred embodiment, display device 340 is an LCD display. Display device 340 displays data entry queues and commands to the user which inform the user of (i) the information that the user must input, or (ii) the actions the user must take. Display device 340 also displays messages relating to the validity of the user identification data inputted by the user and whether access to the cabinet drawer is authorized or denied. For example, display device 340 can display the following messages:

h) "Input PIN Code"
i) "Swipe Card"
j) "Invalid PIN Code"
k) "Re-type PIN Code"
l) "Invalid Card"
m) "Authorized Access"
n) "Access Denied"

These messages are just some examples. Computer 320 may be programmed to cause display device 340 to display other messages and information as well.

As described in the ensuing description, if a user is authorized to have access to any of the drawers, computer 320 issues a control signal that causes the particular drawer to be unlocked. After the user is finished with his task, he closes the cabinet drawer. Upon closing the cabinet drawer 62, the corresponding latch 302 engages the drawer to lock the drawer as described in the foregoing description. When the latch 302 engages the drawer, the corresponding latch control circuit 301 outputs a latch status signal that is inputted into USB hub 306. This latch status signal indicates the drawer is now locked. The latch status signal is then routed to computer 320. Computer 320 then updates the status of the latch 302. The only way the user can reopen the drawer is for the user to input his user identification data again into user input device 308.

It is to be understood that USB hub 306 can be realized by more than one USB hub, wherein one of such USB hubs would serve as a USB-relay board that is in electrical signal communication with all of latch control circuits 301.

Referring to FIG. 19, control system 300 further comprises a fan system that comprises a plurality of fans 350 located within the interior of and attached to cabinet 50. Specifically, each fan 350 is attached to an interior structure or interior wall of cabinet 50 so that it is in proximity to the rear wall 70 of a corresponding cabinet drawer 62. As described in the foregoing description, each cabinet drawer 62 has a plurality of vent slots 74 formed in the rear wall 70 (see FIGS. 9 and 10). Each corresponding fan 350 produces an airflow that passes through the vent slots 74 and into the interior of drawer 62. The fan system further includes a plurality of fan control circuits 352, wherein each fan control circuit 352 outputs signals to control the operation of a corresponding fan 350. Each fan control circuit 352 is in electronic signal communication with USB hub 354. USB hub 354 is in electronic signal communication with USB hub 306. Each fan control circuit 352 comprises programmable electronic circuitry that generates fan control signals and stores data that is generated by computer 320. Such data generated by computer 320 defines predetermined "ON" and "OFF" temperature set points. Computer 320 provides the predetermined "ON" and "OFF" temperature set points to the fan control circuits 352 via USB hubs 306 and 354. The fan control system further comprises a plurality of temperature sensing devices 360. Each temperature sensing device 360 is in electronic signal communication with a corresponding fan control circuit 352. Each temperature sensing device 360 generates a temperature signal that represents the sensed or measured temperature. This temperature signal is inputted into the electronic circuitry of a corresponding fan control circuit 352 wherein it is compared to the predetermined "ON" and "OFF" temperature set points. If the sensed or measure temperature is above the predetermined "ON" temperature set point, the fan control circuit 352 outputs a control signal that initiates operation of its corresponding fan 350. If the sensed or measured temperature is below the predetermined "OFF" temperature set point, then fan control circuit 352 outputs a control signal that turns off the corresponding fan 350.

In a preferred embodiment, each temperature sensing device 360 is located within a corresponding cabinet drawer 62 and outputs an electronic signal that represents the temperature within that cabinet drawer 62. In one embodiment, each temperature sensing device 360 is attached to the peripheral portion 90 of the bottom panel 72 of drawer 62 as described in the foregoing description with respect to temperature sensors 164 of control system 100.

In an alternate embodiment, each temperature sensing device 360 is attached to one of the sidewalls 66 and 68 of the drawer 62.

In a preferred embodiment, each fan control circuit 352 includes programmable circuitry that is programmed to ramp up the speed of each fan 350.

In alternate embodiment, temperature sensing devices 360 are in electronic signal communication with USB hub 354. Since computer 320 is in electronic signal communication with USB hub 306, which is in electronic signal communication with USB hub 354, computer 320 receives the signals outputted by temperature sensing devices 360. Computer 320 processes the signals outputted by temperature sensing devices 360 to determine if the temperature in any of the drawers 62 is above or below the predetermined "ON" and "OFF" temperature set points. Depending upon the temperature in each drawer 62, computer 320 will output fan-start up signals to the fan control circuits 352 that correspond to those drawers 62 having temperatures that exceed the predetermined "ON" temperature set point. If the temperatures in any of the drawers 62 are below the predetermined "OFF" set point, then computer 320 will issue fan-stop signals to the fan circuits 352 to turn off the fans 350 that correspond to the drawers 62 having the lower temperatures. In this embodiment, computer 320 is programmed to control each fan 350 independently. Thus, computer 320 can initiate operation of one fan 350 while leaving off the remaining fans.

In an alternate embodiment, the fan system is arranged so that one fan 350 corresponds to a group of drawers 62. In such an embodiment, a plurality of temperature sensing devices 360 are in electronic signal communication with the fan control circuit 352 that corresponds to that one fan 350. Thus, the one fan 350 will be activated whenever any of the temperature sensing devices 360 measure or sense a temperature that is above the predetermined "ON" temperature set point. In such an embodiment, the size of the fan 350 is large enough to provide sufficient air flow for at least four drawers.

Referring to FIG. 19, control system 300 further comprises a power supply 380 which provides predetermined D.C. voltages to components of control system 300. Specifically, power supply 380 converts an input A.C. voltage into one or more D.C. voltages that are used to power the computer 320, latch control circuits 301, fan control circuits 352, the components of user input device 308, display device 340, USB hub 306 and other components.

Figure 20:
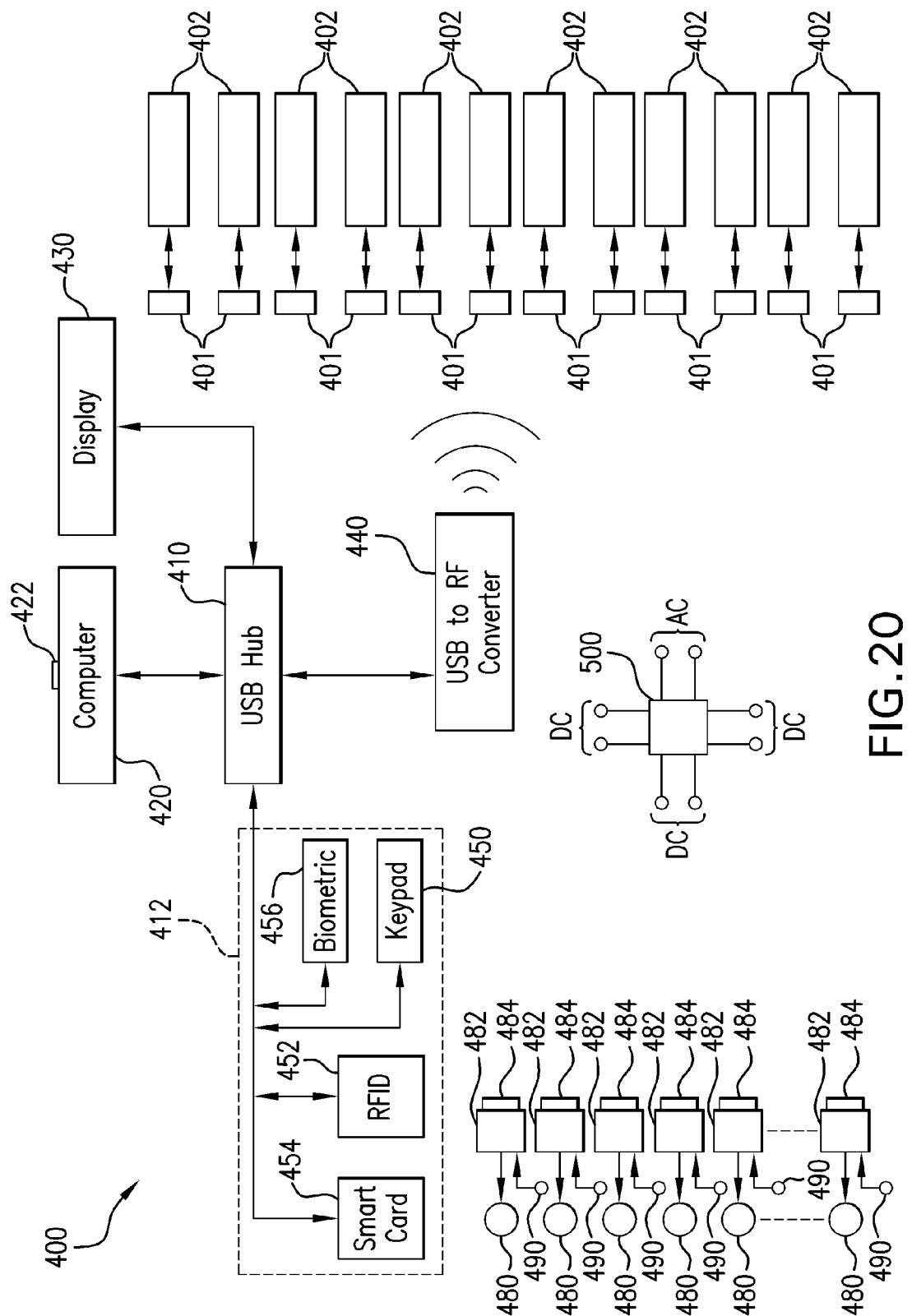
FIG. 20 is a block diagram of a control system of the computer-controlled common access cabinet in accordance with a further embodiment of the present invention.

Referring to FIG. 20, there is shown control system 400 in accordance with a further embodiment of the invention. Control system 400 controls the operation of a common access cabinet 50. Control system 400 further comprises a plurality of latch control circuits 401 and a plurality of latches 402. Each latch control circuit 401 corresponds to a particular latch 402. Each latch control circuit 401 is in electrical signal communication with its corresponding latch 402. Latch control circuits 401 and latches 402 are mounted within the interior of cabinet 50. Each latch 402 comprises a latch member, similar to latch member 103 discussed above, that engages and disengages vertical member 109 of a corresponding cabinet drawer 62. Each latch 402 is positioned in proximity to the rear wall 70 of a corresponding cabinet drawer 62 in the same manner as latches 102 and 302, described in the foregoing description. Each latch control circuit 401 comprises an RF (radio-frequency) transceiver that is configured to receive RF signals. Each latch control circuit 401 comprises electronic circuitry that includes data storage circuitry to store a predetermined address that is assigned to the drawer 62 that corresponds to the latch control circuit 401. When a latch control circuit 401 receives a radio frequency signal containing information that defines the address of its corresponding drawer 62, the latch control circuit 401 outputs a voltage signal (e.g. 24 VDC) to control the corresponding latch 402 so that the latch member disengages and releases the corresponding cabinet drawer 62. As a result, a user will be able to pull the drawer 62 outward. The RF transceiver of each latch control circuit 401 transmits an acknowledgment signal that it has received the RF control signal and has outputted the voltage signal to the corresponding latch 402. When a user pushes the drawer 62 completely into cabinet 50, the corresponding latch 402 engages the drawer so as to lock the drawer 62 in the same manner as latches 102 and 302 described in the foregoing description. In one embodiment, each latch 402 comprises a commercially available electronic rotary latch manufactured by Southco, Inc. of Concordville, Pa., having Part No. R4-EM-11-161.

Referring to FIG. 20, control system 400 further comprises multi-port USB hub 410 and user input device 412. User input device 412 is in electronic signal communication with USB hub 410. User input device 412 is configured for receiving user identification data inputted by a user. The user identification data identifies the user and the cabinet drawer or drawers 62 to which the user is authorized to access. User input device 412 is described in detail in the ensuing description.

Control system 400 further comprises computer 420. Computer 420 is in electronic signal communication with the USB hub 410. Computer 420 comprises a programmable microprocessor, random access memory, read-only-memory, drivers and additional data storage devices for storing therein user identification data and data identifying the cabinet drawers 62 to which a user is entitled to access. Computer 420 also stores the predetermined, unique address assigned to each drawer 62 of cabinet 50. Computer 420 processes the user identification data to determine if the user identification data is valid and if the user is authorized to access to any of the cabinet drawers 62. Computer 420 is programmed to output latch control signals that will control one or more latches to unlock one or more cabinet drawers 62 in accordance with valid user identification data. In a preferred embodiment, computer 420 includes data communication port 422 that is configured to be linked to a network. In one embodiment, the data communication port 422 comprises an Ethernet port. Computer 420 further includes additional data processing resources for receiving updated user identification data and other information through the data communication port 422 from a remote computer and/or database.

Control system 400 further comprises display device 430 which is in electronic signal communication with the USB hub 410. Display device 430 provides the same functions as display devices 140 and 340 described in the foregoing description. Display device 430 displays to the user (i) data entry queues and commands, and (ii) messages pertaining to the validity of the user identification data inputted by the user, and messages informing the user whether access is authorized or denied. In one embodiment, display device 430 comprises an LCD display. Control system 400 further comprises USB-To-RF converter 440 that is in electronic data signal communication with the USB hub 410. Converter 440 comprises a radio-frequency transceiver and a receiver for transmitting and receiving, respectively, radio-frequency signals. Converter 440 comprises a USB port that is in electronic signal communication with USB hub 410. Converter 440 converts USB data signals to radio-frequency signals and then transmits the RF (radio-frequency) signals. These RF signals are received by the transceivers of the latch control circuits 401. The radio-frequency signals contain information that defines one or more addresses that correspond to one or more drawers 62. All latch control circuits 401 receive these RF signals but only a latch control circuit 401 having a stored address that matches the address in the RF signal will respond and output a voltage signal (e.g. 24 VDC) to its corresponding latch 402. This voltage signal will cause the corresponding latch 402 to disengage the corresponding drawer 62. Each latch control circuit 401 also transmits a latch status signal. Converter 440 receives these RF latch-status signals and converts these RF signals into digital signals. These digital signals are then inputted into USB hub 410 which then routes these status signals to computer 420. In one embodiment, converter 440 is a Model RF-FLBTAD converter, manufactured by Rockfish, Inc.

Referring to FIG. 20, user input device 412 is now discussed in detail. In a preferred embodiment, user input device 412 comprises keypad 450, RFID card reader 452, smart card reader 454 and biometric reader 456, all of which are in electronic signal communication with the USB hub 410. Computer 420 may be programmed to implement any one of a number of access protocols. These protocols are as follows:

1) KEYPAD ONLY: A user is granted access by using keypad 450 only and entering a valid PIN (personal identification number) code and then typing "ENTER". In a preferred embodiment, the PIN code is between 4 and 20 digits.
2) SMART CARD and KEYPAD: A user is granted access by using Smart Card (e.g. memory card) reader 454 and keypad 450. In this protocol, in order to be granted access, a user must insert a valid Smart Card (e.g. memory card) into Smart Card reader 454 and enter a valid PIN code into keypad 450.
3) BIOMETRIC READER and KEYPAD: An authorized user is granted access by swiping his finger over biometric reader 456 and inputting a PIN code via keypad 450.
4) RFID CARD ONLY: An authorized user is granted access by holding his Radio Frequency Identification card or tag near RFID Card Reader 452. RFID Card Reader 452 automatically reads the card and computer 420 implements a search of its stored user identification data for the user. If computer 420 finds the user, then computer 420 issues a latch control signal that causes the unlocking of the drawer 62 to which that user is authorized to have access.

In a further embodiment, user input device 412 further comprises a card reader (not shown) that is configured to read government issued DoD-CAC cards (or PIV cards). In such an embodiment, the card reader is used in conjunction with keypad 450. Thus, in addition to the user placing his DoD-CAC card near the card reader, the user must also punch in a valid PIN code using keypad 450.

Thus, in order for a user to gain access to one or more cabinet drawers 62, the user inputs user identification data using user input device 412. The user identification data is inputted into computer 420. Computer 420 processes the user identification data to determine if it is valid data. If it is valid data, computer 420 generates (i) a message for display on display device 430 that informs the user that access has been authorized, and (ii) a latch control signal that will cause the cabinet drawers, identified in the user identification data, to be unlocked. This latch control signal is inputted into USB hub 410 which routes the latch control signal to converter 440. Converter 440 converts the latch control signal into an RF signal. This RF signal contains information that defines the address corresponding to a particular cabinet drawer 62 identified in the validated user identification data. As described in the foregoing description, all of the latch control circuits 401 receive this RF signal, but only the latch control circuit 401 having the matching address will respond and output a voltage signal to its corresponding latch 402 so as to unlock the corresponding cabinet drawer 62. The remaining latch control circuits 402 will not respond since their addresses were not contained in the RF signal transmitted by converter 440. If the user identification data is invalid, then computer 420 issues a message for display on display device 430 that informs the user that access to the cabinet drawers is denied and the reason why access is denied. In such a case, computer 420 does not issue any type of latch control signal since the user is not authorized to access any of the cabinet drawers.

After the user is finished with his task, he closes the cabinet drawer. Upon closing the cabinet drawer, the corresponding latch 402 engages the vertical member 109 on the rear wall 70 of cabinet drawer 62 to lock the drawer and the RF transceiver of the corresponding latch control circuit 401 transmits a latch status signal containing data that indicates the drawer is now locked. Converter 440 receives the latch status signal and converts it to USB data which is inputted into USB hub 410 and then routed to computer 420. The only way the user can reopen the drawer is for the user to again input his user identification data into user input device 412.

Control system 400 further comprises a fan system that comprises a plurality of fans 480. Each fan 480 is positioned within cabinet 50 and corresponds to a particular cabinet drawer 62. Each fan 480 is positioned in proximity to the rear wall 70 of the corresponding cabinet drawer 62. The fan system further comprises a plurality of fan control circuits 482. Each fan control circuit 482 is electrically connected to a correspond fan 480 and comprises an RF transceiver 484 for receiving and transmitting RF signals. Each fan control circuit 482 further comprises electronic circuitry that stores data generated by computer 420. Such computer generated data includes the predetermined "ON" and "OFF" temperature set points that were described in the foregoing description with respect to control systems 100 and 300. Specifically, the data signals representing the predetermined "ON" and "OFF" temperature set points generated by computer 420 are inputted into USB hub 410 which then routes these data signals to converter 440. Converter 440 converts the data signals into RF signals that are received by the RF transceivers 484. The fan control circuits 482 receives and stores these data signals. Control system 400 further comprises a plurality of temperature sensing devices 490. Each temperature sensing device 490 is in electronic signal communication with a corresponding fan control circuit 482. Each temperature sensing device 490 corresponds to a particular cabinet drawer and outputs electronic signals that represent the temperature within that particular cabinet drawer. Each fan control circuit 482 controls its corresponding fan 480 based on the sensed or measured temperature and the predetermined "ON" and "OFF" temperature set points measured. Thus, fan control circuits 482 control fans 480 in the same manner in which fan control circuits 162 control fans 160, and in the same manner in which fan control circuits 352 control fans 350. As is apparent from the foregoing description, the operation of one fan 480 is independent from the operation of the other fans 480.

In a preferred embodiment, each fan control circuit 482 has programmable circuitry to allow it to ramp-up fan speed during fan start-up mode in accordance with a predetermined ramp rates, and ramp-down fan speed during fan shut-off mode in accordance with a predetermined ramp-down rate.

In an alternate embodiment, the fan system is arranged so that one fan 480 corresponds to a group of drawers 62. In such an embodiment, a group of temperature sensing devices 490 is in electronic signal communication with one fan control circuit 482. The fan control circuit 482 controls one fan 480.

Thus, the one fan 480 will be activated whenever any of the temperature sensing devices 490 measure or sense a temperature that is above the predetermined "ON" temperature set point. In such an embodiment, the fan 480 is large enough and positioned so that it can sufficiently provide a cooling airflow to a group of drawers (e.g. four drawers).

Referring to FIG. 20, control system 400 further comprises a power supply 500 which provides predetermined D.C. voltages to components of control system 400. Specifically, power supply 500 converts an input A.C. voltage into one or more D.C. voltage levels that are used to power the computer 420, latch control circuits 401, fan control circuits 482, the components of user input device 412, display device 430, converter 440, USB hub 410 and other components.

The principles, preferred embodiments and modes of operation of the present invention have been described in the foregoing specification. The invention which is intended to be protected herein should not, however, be construed as limited to the particular forms disclosed, as these are to be regarded as illustrative rather than restrictive. Variations in changes may be made by those skilled in the art without departing from the spirit of the invention. Accordingly, the foregoing detailed description should be considered exemplary in nature and not limited to the scope and spirit of the invention as set forth in the attached claims.

What is claimed is:

1. A control system for controlling the operation of a common access cabinet that has a plurality of cabinet drawers that are movable between a closed position and an opened position, the control system comprising:
   a plurality of latch systems mounted within the cabinet, wherein each latch system is positioned in proximity to a corresponding cabinet drawer and configured to receive a control signal, wherein a latch system unlocks the corresponding cabinet drawer to allow the cabinet drawer to be moved to the opened position when the latch system receives a latch control signal that defines an address that is assigned to the cabinet drawer to which that latch system corresponds;
   an asynchronous serial interface bus in electronic signal communication with the plurality of latch systems;
   a user input device to enable a user to input user identification data that identifies the user and the cabinet drawer to which the user is authorized to access;
   a processor to process the user identification data to determine if the user identification data is valid, and generate a latch control signal that defines an address of a drawer identified by the user identification data if the user identification data is valid;
   a converter to convert the latch control signal to an asynchronous serial signal and provide the asynchronous serial signal to the asynchronous serial interface bus so that all latch systems receive the latch control signal;
   a plurality of fans located within the interior of and attached to the cabinet, each fan located adjacent to a corresponding drawer;
   a plurality of fan control circuits, each fan control circuit being in electronic signal communication with the asynchronous serial interface bus and comprising electronic circuitry for generating control signals to control the operation of a corresponding fan, wherein the electronic circuitry receives predetermined temperature threshold data generated by the processor; and
   a plurality of temperature sensing devices, each temperature sensing device being associated with a particular cabinet drawer and outputting electronic signals representing the temperature within that cabinet drawer, each temperature sensing device being in electronic signal communication with a corresponding fan control circuit, wherein each fan control circuit controls its corresponding fan based on the relation of the sensed temperature to the predetermined temperature threshold data.

2. The control system according to claim 1 wherein each latch system comprises a control circuit and a corresponding latch that is responsive to the control circuit, wherein the control circuit is configured to receive the asynchronous serial signals from the asynchronous serial interface bus.

3. The control system according to claim 1 further comprising a USB hub having a port for receiving the latch control signal and another port in electronic signal communication with the converter.

4. The control system according to claim 1 wherein the processor device and user input device are in electronic signal communication with the USB hub.

5. The control system according to claim 4 wherein the user input device is also in electronic signal communication with the asynchronous serial interface bus.

6. The control system according to claim 4 further comprising a display device in electronic signal communication with the USB hub for displaying (i) data entry queues and commands, and (ii) messages relating to the validity of the user identification data inputted by the user and informing the user whether authorization is granted or denied.

7. The control system according to claim 3 wherein the converter comprises an asynchronous serial interface port in electronic signal communication with the asynchronous serial interface bus, the converter device further comprising a USB signal port in electronic signal communication with the USB hub, wherein the converter converts USB signals received at its USB signal port into asynchronous serial data signals and converts asynchronous serial data signals received at its asynchronous serial interface port into USB signals.

8. The control system according to claim 1 wherein the asynchronous serial interface bus comprises a RS-485 bus.

9. The control system according to claim 1 wherein the processor comprises a computer having a programmable microprocessor, a data memory for storing therein user identification data and data identifying the cabinet drawers to which a user is entitled to access, and a USB port for outputting the control signals to selectively unlock one or more cabinet drawers in accordance with valid user identification data.

10. The control system according to claim 9 wherein the computer has a data communication port configured to be linked to a computer network to enable the computer to receive updated user identification data.

11. The control system according to claim 1 wherein the converter comprises a USB-To-RS-485 converter.

12. The control system according to claim 3 wherein the user input device comprises a smart card reader in electronic signal communication with the USB hub and a keypad in electronic signal communication with the asynchronous serial interface bus.

13. The control system according to claim 3 wherein the user input device comprises a RFID card reader in electronic signal communication with the USB hub and a keypad in electronic signal communication with the asynchronous serial interface bus.

14. The control system according to claim 3 comprising:
   a keypad in electronic signal communication with the asynchronous serial interface bus;
   a RFID card reader in electronic signal communication with the USB hub;

a smart card reader in electronic signal communication with the USB hub; and a biometric reader in electronic signal communication with the USB hub.

15. The control system according to claim 3 wherein the user input device comprises a biometric reader in electronic signal communication with the USB hub.

16. A control system for controlling a common access cabinet having a plurality of cabinet drawers that are movable between a closed position and an opened position, the control system comprising:

a plurality of latch systems mounted within the cabinet, wherein each latch system is positioned in proximity to a corresponding cabinet drawer and configured to receive a control signal, wherein a latch system unlocks its corresponding cabinet drawer to allow the cabinet drawer to be moved to the opened position when the latch system receives a latch control signal that defines an address that is assigned to the cabinet drawer to which that latch system corresponds;

a USB hub device in electronic signal communication with all of the latch systems;

a user input device in electronic signal communication data with the USB hub to allow a user to input user identification data that identifies the user and the cabinet drawer to which the user is authorized to access;

a processor in electronic signal communication with the USB hub to process the user identification data received by the user input device to determine if the user identification data is valid and generate a latch control signal having an address of a cabinet drawer identified by the user identification data if the user identification data is valid;

a plurality of fans located within the interior of and attached to the cabinet, each fan located in proximity to a corresponding cabinet drawer;

a plurality of fan control circuits, each fan control circuit being in electronic signal communication with the USB hub and comprising electronic circuitry to generate control signals that control the operation of a corresponding fan, wherein the electronic circuitry receives predetermined temperature threshold data generated by the processor; and a plurality of temperature sensing devices, each temperature sensing device being associated with a particular cabinet drawer and outputting electronic signals representing the temperature within that cabinet drawer, each temperature sensing device being in electronic signal communication with a corresponding fan control circuit, wherein each fan control circuit controls its corresponding fan based on the relation of the sensed temperature to the predetermined temperature threshold data.

17. The control system according to claim 16 further comprising a display device in electronic signal communication with the USB hub for displaying (i) data entry queues and commands, and (ii) messages pertaining to the validity of the user identification data inputted by the user, and messages informing the user whether access is authorized or denied.

18. The control system according to claim 16 wherein the user input device comprises a keypad.

19. The control system according to claim 16 wherein the user input device comprises a smart card reader and a keypad.

20. The control system according to claim 16 wherein the user input device comprises a RFID card reader and a keyboard.

21. The control system according to claim 16 wherein the user input device comprises a biometric reader.

22. The control system according to claim 16 wherein the user input device comprises a keypad, a RFID card reader, a smart card reader, and a biometric reader.

23. The control system according to claim 16 wherein the processor has a data communication port configured to be linked to a computer network in order to receive updated user identification data from a remote database.

24. A control system to control a common access cabinet having a plurality of cabinet drawers, wherein each cabinet drawer is movable between a closed position and an opened position, the control system comprising:

a plurality of latches, wherein each latch corresponds to a particular cabinet drawer and comprises a radio-frequency (RF) transceiver for receiving RF signals, wherein a latch unlocks its corresponding cabinet drawer to enable the cabinet drawer to be moved to the opened position when the latch's RF transceiver receives an RF signal that defines an address assigned to the cabinet drawer to which that latch corresponds;

a USB hub;

a user input device in electronic signal communication data with the USB hub for receiving user identification data inputted by a user, wherein the user identification data identifies the user and the cabinet drawer or drawers to which the user is authorized to access;

a processor in electronic signal communication with the USB hub to process the user identification data received by the user input device to determine if the user identification data is valid, and generate a latch control signal defining a cabinet drawer address that is identified in the user identification data if the user identification data is valid;

a converter in electronic data signal communication with the USB hub to convert the latch control signals into RF signals and transmit the RF signals for reception by the RF transceivers of the latches;

a plurality of fans, each fan positioned within the cabinet and corresponding to a particular cabinet drawer;

a plurality of fan control circuits, each fan control circuit comprising electronic circuitry to generate control signals to control the operation of a corresponding fan, wherein the electronic circuitry receives predetermined temperature threshold data generated by the processor, each fan control circuit comprising a RF transceiver for receiving and transmitting RF signals;

said processor being programmed to provide data signals that represent the predetermined temperature threshold data wherein said data signals are inputted into said USB hub and then routed to said converter which converts said data signals to RF signals that are received by said RF transceiver of each of the fan-control circuits; and a plurality of temperature sensing devices, each temperature sensing device being associated with a particular cabinet drawer and outputting electronic signals representing the temperature within that cabinet drawer, each temperature sensing device being in electronic signal communication with a corresponding fan control circuit, wherein each fan control circuit controls its corresponding fan based on the relation of the sensed temperature to the predetermined temperature threshold data.

25. The control system according to claim 24 further comprising a display device in electronic signal communication with the USB hub for displaying (i) data entry queues and commands, and (ii) messages pertaining to the validity of the user identification data inputted by the user, and messages informing the user whether access is authorized or denied.

26. The control system according to claim 24 wherein the user input device comprises a keypad.

27. The control system according to claim 24 wherein the user input device comprises a smart card reader and a keypad.

28. The control system according to claim 24 wherein the user input device comprises a RFID card reader and a keyboard.

29. The control system according to claim 24 wherein the user input device comprises a biometric reader.

30. The control system according to claim 24 wherein the user input device comprises:
- a keypad in electronic data signal communication with the USB hub;
- a RFID card reader in electronic signal communication with the USB hub;
- a smart card reader in electronic signal communication with the USB hub; and
- a biometric reader in electronic signal communication with the USB hub.

31. The control system according to claim 24 wherein the processor comprises a computer that includes a data communication port for receiving updated user identification data from a remote computer.

32. A method for controlling a common access cabinet, comprising:
- providing a common access cabinet comprising a user input device, a processor, a plurality of drawers that are moveable between a closed position and an opened position, a plurality of drawer latches, wherein each drawer latch corresponds to a particular drawer and is configured to receive a control signal that defines an address assigned to a drawer, and an asynchronous serial interface bus in electronic signal communication with the plurality of latches for providing latch control signals to the latches, wherein a latch unlocks its corresponding drawer so as to allow the drawer to be positioned in the opened position when that latch receives a latch control signal that defines the address of the drawer to which that latch corresponds, the common access cabinet further comprising a plurality of fan systems, wherein each fan system is located in proximity to a corresponding drawer and in electronic signal communication with the USB hub, the common access cabinet including a plurality of temperature sensors in communication with the USB hub, wherein each temperature sensor is associated with a particular cabinet drawer and provides electronic signals representing the sensed temperature within that cabinet drawer;
- inputting into the user input device user identification data that identifies the user and the cabinet drawer to which the user is authorized to access;
- processing the user identification data with the processor to determine if the user identification data is valid;
- generating a latch control signal that defines a drawer address that is identified in the user identification data if the processing step determines that the user identification data is valid;
- converting the latch control signal into an asynchronous serial signal;
- routing the asynchronous signals to the asynchronous serial interface bus so that the latch control signal is received by all of the latches;
- sensing the temperature within each cabinet drawer;
- determining if any of the sensed temperatures exceed a predetermined temperature; and
- operating the fans that correspond to the cabinet drawer having sensed temperatures that exceed the predetermined temperature in order to decrease the temperature within the cabinet drawer.

33. The method according to claim 32 wherein the common access cabinet further comprises a display device in electronic signal communication with the user input device, the method further comprising displaying (i) data entry queues and commands, and (ii) messages relating to the validity of the user identification data inputted by the user and informing the user whether authorization is granted or denied.

34. A method for controlling a common access cabinet, comprising:
- providing a common access cabinet comprising a user input device, a processor, a plurality of cabinet drawers that are moveable between a closed position and an opened position, and a plurality of drawer latches, wherein each drawer latch corresponds to a particular cabinet drawer and is configured to receive a latch control signal that defines an address assigned to a drawer, the common access cabinet including a USB hub in electronic signal communication with the user input device and the plurality of latches for providing latch control signals to the latches, wherein a latch unlocks its corresponding cabinet drawer so as to allow the cabinet drawer to be positioned in the opened position when that latch receives a latch control signal that defines the address of the cabinet drawer to which that latch corresponds;
- inputting into the user input device user identification data that identifies the user and the cabinet drawer or drawers to which the user is authorized to access;
- processing the user identification data with the processor to determine if the user identification data is valid;
- generating a latch control signal that defines a drawer address that is identified in the user identification data if the processor determines the user identification data is valid;
- routing the latch control signal to the USB hub so that latch control signal is received by all of the latches;
- sensing the temperature within each cabinet drawer;
- determining if any of the sensed temperatures exceeds a predetermined temperature; and
- air cooling the cabinet drawers having sensed temperatures that exceed the predetermined temperature in order to decrease the temperature within the cabinet drawer.

35. The method according to claim 34 wherein the common access cabinet further comprises a display device in electronic signal communication with the USB hub, the method further comprising displaying (i) data entry queues and commands, and (ii) messages relating to the validity of the user identification data inputted by the user and informing the user whether authorization is granted or denied.

36. A method for controlling the operation of a common access cabinet, comprising:
- providing a common access cabinet that has a user input device, a processor, a USB hub in electronic signal communication with the user input device and processor, a plurality of drawers that are moveable between a closed position and an opened position, and a plurality of latches, wherein each latch corresponds to a particular drawer and comprises a radio-frequency (RF) transceiver for receiving RF control signals, wherein when the latch's RF transceiver receives an RF control signal that defines an address assigned to the drawer to which that latch corresponds, that latch unlocks the corresponding drawer to allow the drawer to be moved to an opened position;

inputting into the user input device user identification data that identifies the user and the cabinet drawer to which the user is authorized to access;

processing the user identification data with the processor to determine if the user identification data is valid;

generating a latch control signal that defines a drawer address that is identified in the user identification data if the processing step determines that the user identification data is valid;

converting the latch control signal to an RF latch control signal; and transmitting the RF latch control signal so that it is received by the RF transceivers of the latches;

sensing the temperature within each cabinet drawer;

determining if any of the sensed temperatures exceed a predetermined temperature; and air cooling the cabinet drawers having sensed temperatures that exceed the predetermined temperature.

37. The method according to claim 36 wherein the common access cabinet further comprises a display device in electronic signal communication with the USB hub, the method further comprising displaying (i) data entry queues and commands, and (ii) messages relating to the validity of the user identification data inputted by the user and informing the user whether authorization is granted or denied.

\* \* \* \* \*